US009672180B1

(12) United States Patent
Morshed et al.

(10) Patent No.: US 9,672,180 B1
(45) Date of Patent: Jun. 6, 2017

(54) CACHE MEMORY MANAGEMENT SYSTEM AND METHOD

(71) Applicant: Sanmina Corporation, San Jose, CA (US)

(72) Inventors: Abbas Morshed, Los Altos, CA (US); Jon Livesey, Sunnyvale, CA (US); Sharad Mehrotra, Saratoga, CA (US)

(73) Assignee: Sanmina Corporation, San Jose, CA (US)

( * ) Notice: Subject to any disclaimer, the term of this patent is extended or adjusted under 35 U.S.C. 154(b) by 80 days.

(21) Appl. No.: 14/552,329

(22) Filed: Nov. 24, 2014

Related U.S. Application Data

(63) Continuation of application No. 14/453,105, filed on Aug. 6, 2014, now abandoned.

(51) Int. Cl.
G06F 13/00 (2006.01)
G06F 3/00 (2006.01)
G06F 5/00 (2006.01)
G06F 11/00 (2006.01)
G06F 13/40 (2006.01)
(Continued)

(52) U.S. Cl.
CPC ...... *G06F 13/4022* (2013.01); *G06F 12/0811* (2013.01); *G11C 15/00* (2013.01); *G06F 2212/283* (2013.01)

(58) Field of Classification Search
CPC ............. G06F 11/0727; G06F 11/2092; G06F 11/2089; G06F 3/067; G06F 3/0689
USPC ..................... 710/38, 316; 714/43
See application file for complete search history.

(56) References Cited

U.S. PATENT DOCUMENTS 5,615,329 A * 3/1997 Kern ................... G06F 11/2064
714/6.12
5,719,887 A 2/1998 Kazuno
(Continued)

FOREIGN PATENT DOCUMENTS

WO   WO-2009143381 A2   11/2009

OTHER PUBLICATIONS

"U.S. Appl. No. 13/844,663, Notice of Allowance mailed Jul. 6, 2015", 7 pgs.
(Continued)

*Primary Examiner* — Faisal M Zaman
(74) *Attorney, Agent, or Firm* — Schwegman Lundberg & Woessner, P.A.

(57) ABSTRACT

A system comprises a first cache controller and at least a second cache controller. The first cache controller and the second cache controller each include a cache memory interface, an inter-cache controller communication link configured for bidirectional communication with the other cache controller, a first peripheral interface, a second peripheral interface, and logic circuitry. The first peripheral interface communicates with a first host device and the second peripheral interface communicates with a second host device. The first host device and the second host device are each connected to the first and second cache controllers by the first and second peripheral interfaces. The logic circuitry loads a cache command from a cache command memory of the first host device, loads a cache command from a cache command memory of the second cache controller, and performs the cache commands.

18 Claims, 15 Drawing Sheets

(51) Int. Cl.
*G06F 12/0811* (2016.01)
*G11C 15/00* (2006.01)

(56) References Cited

U.S. PATENT DOCUMENTS

| | | | | |
|---|---|---|---|---|
| 5,724,501 | A * | 3/1998 | Dewey | G06F 12/0866 |
| | | | | 711/E12.019 |
| 5,809,524 | A | 9/1998 | Singh et al. | |
| 6,032,232 | A | 2/2000 | Lindeborg et al. | |
| 6,061,750 | A * | 5/2000 | Beardsley | G06F 11/2092 |
| | | | | 710/10 |
| 6,173,367 | B1 * | 1/2001 | Aleksic | G06F 12/0848 |
| | | | | 711/129 |
| 6,205,507 | B1 * | 3/2001 | Elkhoury | G06F 12/0835 |
| | | | | 710/260 |
| 6,460,122 | B1 * | 10/2002 | Otterness | G06F 11/1076 |
| | | | | 711/122 |
| 6,529,963 | B1 | 3/2003 | Fredin et al. | |
| 6,604,154 | B1 | 8/2003 | Takegami et al. | |
| 6,725,337 | B1 | 4/2004 | Tan et al. | |
| 6,820,171 | B1 * | 11/2004 | Weber | G06F 3/0626 |
| | | | | 711/114 |
| 6,928,514 | B2 * | 8/2005 | Chatterjee | G06F 3/0613 |
| | | | | 711/114 |
| 6,983,396 | B2 * | 1/2006 | Brant | G06F 12/0866 |
| | | | | 710/314 |
| 7,117,275 | B1 | 10/2006 | Ofek et al. | |
| 7,210,071 | B2 | 4/2007 | Deacon et al. | |
| 7,299,266 | B2 | 11/2007 | Boyd et al. | |
| 7,836,204 | B2 * | 11/2010 | Kalos | G06F 11/2007 |
| | | | | 709/239 |
| 8,117,376 | B2 * | 2/2012 | Hemmi | G06F 11/1088 |
| | | | | 711/103 |
| 8,495,329 | B2 | 7/2013 | Duffy et al. | |
| 8,621,154 | B1 | 12/2013 | Goldschmidt et al. | |
| 9,118,698 | B1 * | 8/2015 | Radovanovic | H04L 67/1097 |
| 9,286,225 | B2 | 3/2016 | Mehrotra et al. | |
| 9,304,902 | B2 | 4/2016 | Mehrotra et al. | |
| 9,384,147 | B1 * | 7/2016 | Morshed | G06F 12/123 |
| 9,509,604 | B1 | 11/2016 | Livesey et al. | |
| 2002/0172195 | A1 | 11/2002 | Pekkala et al. | |
| 2003/0009643 | A1 | 1/2003 | Arimilli et al. | |
| 2003/0016703 | A1 | 1/2003 | Oldenborgh et al. | |
| 2003/0041211 | A1 | 2/2003 | Merkey et al. | |
| 2003/0084248 | A1 | 5/2003 | Gaither et al. | |
| 2004/0153598 | A1 | 8/2004 | Thatipelli et al. | |
| 2004/0193800 | A1 * | 9/2004 | Krehbiel, Jr. | G06F 3/0607 |
| | | | | 711/115 |
| 2004/0246980 | A1 | 12/2004 | Balakrishnan | |
| 2005/0240809 | A1 * | 10/2005 | Ash | G06F 12/0866 |
| | | | | 714/6.13 |
| 2006/0004956 | A1 | 1/2006 | Madajczak | |
| 2006/0031639 | A1 * | 2/2006 | Benhase | G06F 12/0897 |
| | | | | 711/122 |
| 2006/0193327 | A1 | 8/2006 | Arndt et al. | |
| 2006/0195663 | A1 | 8/2006 | Arndt et al. | |
| 2006/0242354 | A1 | 10/2006 | Johnsen et al. | |
| 2007/0156966 | A1 | 7/2007 | Sundarrajan et al. | |
| 2007/0248017 | A1 | 10/2007 | Hinata et al. | |
| 2008/0016269 | A1 | 1/2008 | Chow et al. | |
| 2008/0137676 | A1 | 6/2008 | Boyd et al. | |
| 2008/0189723 | A1 | 8/2008 | Elliott et al. | |
| 2008/0192648 | A1 | 8/2008 | Galles | |
| 2008/0222500 | A1 | 9/2008 | Tsukamoto et al. | |
| 2008/0244189 | A1 | 10/2008 | Allison et al. | |
| 2008/0313405 | A1 | 12/2008 | Sakata et al. | |
| 2009/0016236 | A1 | 1/2009 | Alcala et al. | |
| 2009/0164700 | A1 | 6/2009 | Chen et al. | |
| 2010/0080117 | A1 * | 4/2010 | Coronado | G06F 11/076 |
| | | | | 370/217 |
| 2010/0241807 | A1 | 9/2010 | Wu et al. | |
| 2010/0293048 | A1 | 11/2010 | Singolda et al. | |
| 2011/0138160 | A1 | 6/2011 | Sato et al. | |
| 2011/0191535 | A1 * | 8/2011 | Yuasa | G06F 12/08 |
| | | | | 711/113 |
| 2011/0238938 | A1 * | 9/2011 | Kloeppner | G06F 3/0611 |
| | | | | 711/162 |
| 2011/0320662 | A1 | 12/2011 | Craddock et al. | |
| 2012/0023282 | A1 | 1/2012 | Rub | |
| 2012/0079199 | A1 | 3/2012 | Beardsley et al. | |
| 2012/0093078 | A1 | 4/2012 | Perlman et al. | |
| 2012/0137289 | A1 | 5/2012 | Nolterieke et al. | |
| 2013/0022201 | A1 | 1/2013 | Glew et al. | |
| 2013/0042066 | A1 * | 2/2013 | Price | G06F 12/0866 |
| | | | | 711/119 |
| 2013/0138911 | A1 | 5/2013 | Gopalakrishnan et al. | |
| 2013/0212431 | A1 | 8/2013 | Ong | |
| 2013/0286846 | A1 | 10/2013 | Atlas et al. | |
| 2013/0311706 | A1 | 11/2013 | Okada | |
| 2014/0040677 | A1 * | 2/2014 | Matsui | G06F 11/1666 |
| | | | | 714/54 |
| 2014/0095785 | A1 | 4/2014 | Nataraj | |
| 2014/0189074 | A1 | 7/2014 | Parker | |
| 2014/0215030 | A1 | 7/2014 | Terwilliger et al. | |
| 2014/0215458 | A1 | 7/2014 | Devarapalli et al. | |
| 2014/0244876 | A1 * | 8/2014 | Colpo | G06F 21/70 |
| | | | | 710/200 |
| 2014/0281140 | A1 | 9/2014 | Mehrotra et al. | |
| 2014/0281153 | A1 | 9/2014 | Mehrotra et al. | |
| 2014/0281169 | A1 | 9/2014 | Mehrotra et al. | |
| 2014/0341029 | A1 | 11/2014 | Allan et al. | |
| 2015/0067253 | A1 * | 3/2015 | Madhusudana | G06F 3/0659 |
| | | | | 711/114 |
| 2015/0095696 | A1 * | 4/2015 | Hess | G06F 11/108 |
| | | | | 714/6.24 |
| 2015/0124611 | A1 | 5/2015 | Attar et al. | |
| 2015/0127797 | A1 | 5/2015 | Attar et al. | |
| 2015/0138973 | A1 | 5/2015 | Kumar et al. | |
| 2016/0117281 | A1 * | 4/2016 | Akaike | G06F 3/06 |
| | | | | 710/313 |
| 2016/0132242 | A1 | 5/2016 | Mehrotra et al. | |

OTHER PUBLICATIONS

"U.S. Appl. No. 13/844,663, Response filed Apr. 24, 2015 to Non Final Office Action mailed Dec. 24, 2014", 13 pgs.
"U.S. Appl. No. 13/931,650, Non Final Office Action mailed Mar. 11, 2015", 23 pgs.
"U.S. Appl. No. 13/931,650, Notice of Allowance mailed Sep. 25, 2015", 9 pgs.
"U.S. Appl. No. 13/931,650, Response filed Jun. 22, 2015 to Non Final Office Action mailed Mar. 11, 2015", 10 pgs.
"U.S. Appl. No. 13/958,310, Non Final Office Action mailed Jul. 17, 2015", 14 pgs.
"U.S. Appl. No. 14/189,275, Non Final Office Action mailed Jul. 16, 2015", 14 pgs.
Jackson, Mike, et al., "PCI Express Technology, Comprehensive Guide to Generations 1.x, 2.x and 3.0", © 2012 by MindShare, Inc., (Sep. 2012), 181 pgs.
"U.S. Appl. No. 13/844,663, Non Final Office Action mailed Dec. 24, 2014", 8 pgs.
"ExpressFabric® pci express as a Converged, Rack-Level Interconnect", PLX Technology, (May 2013), 1-16.
"HP Moonshot System", Family Data Sheet © 2013 Hewlett-Packard Development Company, (Apr. 2013), 8 pgs.
"HP Moonshot System—Technical White Paper", © 2013 Hewlett-Packard Development Company, (2013), 1-8.
"HP Moonshot: An Accelerator for Hyperscale Workloads", © 2013 Moor Insights & Strategy, (2013), 9 pgs.
"Juniper Networks QFabric: Scaling for the Modern Data Center", © 2011 ACG Research, (2011), 1-9.
"Non-Transparent Bridging Simplied—Multi-Host System and Intelligent I/O Design with PCI Express", © 2004 PLX Technology, Inc., (2004), 4 pgs.
"Product Overview—Brief Overview of the Product Families & Applications", PLX Technology, (May 2013), 1-46.
"QFabric tm System", © 2013 Juniper Networks, Inc., (Jun. 2013), 12 pgs.
"Technology Brief PCI Express", PLX Technology, (2003), 5 pgs.

(56) References Cited

OTHER PUBLICATIONS

"The data center of tomorrow: How disruptive will new technologies be?", © 2013 Goldman Sachs, (Apr. 10, 2013), 1-34.
"White Paper: Egenera Cloud Suite", © 2013 Egenera Inc., (2013), 8 pgs.
Blake, Bob, "Choosing the Right Programmable Logic Solution for PCI Express Applications", [online]. Retrieved from the Internet: <URL: http://www.rtcmagazine.com/articles/view/100327>, (Apr. 2005), 1-7.
Budruk, Ravi, "PCI Express® Basics", © 2007, PCI-SIG, (2007), 40 pgs.
Hutchinson, Lee, "The SSD Revolution / An ARS Technica Feature", Solid-state revolution: in-depth on how SSDs really work, (Jun. 4. 2012), 1-27.
Morgan, Timothy P., "'Til heftier engines come aboard, HP Moonshot only about clouds", [online]. [retrieved on Apr. 9, 2013]. Retrieved from the Internet: <URL: http://www.theregister.co.uk/2013/04/09/hp_moonshot_server_analysis/>, (Apr. 9, 2013), 1-8.
Myslewski, Rik, "HP wants to help you mount a Moonshot", [onlline]. [retrieved on Nov. 3, 2013]. Retrieved from the Internet: <URL: http://www.theregister.co.uk/2013/11/02/hp_pathfinder_innovation_ecosystem_and_discovery_lab/>, (2013), 3 pgs.
Regula, Jack, "Using Non-transpatent Bridging in PCI Express Systems", PLX Technology, Inc., (Jun. 1, 2004), 1-31.
Vahdat, Amin, "The Emerging Optical Data Center", OSA/OFC/NFOEC 2011, (2011), 3 pgs.
"U.S. Appl. No. 13/931,650, Notice of Allowance mailed Nov. 9, 2015", 5 pgs.
"U.S. Appl. No. 13/958,310, Advisory Action mailed Mar. 14, 2016", 3 pgs.
"U.S. Appl. No. 13/958,310, Final Office Action mailed Dec. 16, 2015", 16 pgs.
"U.S. Appl. No. 13/958,310, Non Final Office Action mailed Apr. 20, 2016", 24 pgs.
"U.S. Appl. No. 13/958,310, Preliminary Amendment filed Aug. 5, 2013", 10 pgs.
"U.S. Appl. No. 13/958,310, Response filed Feb. 16, 2016 to Final Office Action mailed Dec. 16, 2015", 10 pgs.
"U.S. Appl. No. 13/958,310, Response filed Nov. 3, 2015 to Non Final Office Action mailed Jul. 17, 2015", 10 pgs.
"U.S. Appl. No. 14/189,275, Final Office Action mailed Feb. 11, 2016", 23 pgs.
"U.S. Appl. No. 14/189,275, Preliminary Amendment filed Mar. 5, 2014", 6 pgs.
"U.S. Appl. No. 14/189,275, Response filed Nov. 3, 2015 to Non Final Office Action mailed Jul. 16, 2015", 11 pgs.
"U.S. Appl. No. 14/321,262, Non Final Office Action mailed Aug. 4, 2016", 26 pgs.
"U.S. Appl. No. 14/321,317, Non Final Office Action mailed Mar. 16, 2016", 8 pgs.
"U.S. Appl. No. 14/321,317, Notice of Allowability mailed Oct. 14, 2016", 2 pgs.
"U.S. Appl. No. 14/321,317, Notice of Allowance mailed Jul. 18, 2016", 7 pgs.
"U.S. Appl. No. 14/321,317, Response filed Jun. 23, 2016 to Non Final Office Action mailed Mar. 16, 2016", 14 pgs.
"U.S. Appl. No. 14/552,344, Notice of Allowance mailed Mar. 7, 2016", 10 pgs.
"U.S. Appl. No. 14/552,393, Non Final Office Action mailed Jun. 2, 2016", 7 pgs.
"U.S. Appl. No. 14/552,393, Preliminary Amendment filed May 19, 2015", 5 pgs.
"U.S. Appl. No. 14/552,393, Response filed Oct. 3, 2016 to Non Final Office Action mailed Jun. 2, 2016", 8 pgs.
"U.S. Appl. No. 14/949,518, PTO Response to Rule 312 Communication mailed Oct. 14, 2016", 1 pg.
"Intelligent I/O (120) Architecture Specification", Publisher: 120 Special Interest Group; Version: Draft Revision 1.5, (Mar. 1997), 2 pgs.
"U.S. Appl. No. 14/321,262, Response filed Nov. 4, 2016 to Non Final Office Action mailed Aug. 4, 2016", 16 pgs.
"U.S. Appl. No. 14/552,355, Non Final Office Action mailed Dec. 16, 2016", 23 pgs.
"U.S. Appl. No. 14/552,393, Notice of Allowance mailed Nov. 16, 2016", 5 pgs.
"U.S. Appl. No. 14/552,355, Response filed Feb. 2, 2017 to Non Final Office Action mailed Dec. 16, 2016", 12 pgs.

\* cited by examiner

| 255 | | | | | | | | 0 |
|---|---|---|---|---|---|---|---|---|
| CMD | L/R | DRTY | CW-MSK | SEQ# | EC | KEY/ CQ Index & Entry Cnt | Host Buff Addr | Status Addr | Key Aging Alias |
| Bits: 4 | 1 | 1 | 8 | 20 | 1 | 96 | 64 | 32 | 32 |

*FIG. 12*

| 199 | | | | | | | | 0 |
|---|---|---|---|---|---|---|---|---|
| Cmpl Status | Furthest Cmpl Ptr | CF CMD | DRTY | OWNER | RES | L/R | SEQ# | EC | Cache Key / Number of Returned Entries & Index of the Last Valid Entry | Key Aging Alias |
| Bits: 8 | 32 | 4 | 1 | 1 | 4 | 1 | 20 | 1 | 96 | 32 |

*FIG. 13*

CACHE MEMORY MANAGEMENT SYSTEM AND METHOD

CLAIM OF PRIORITY

This Application is a Continuation Application of U.S. application Ser. No. 14/453,105, filed Aug. 6, 2014, the contents of which are hereby incorporated by reference in its entirety and the benefit of priority is claimed herein.

TECHNICAL FIELD

The present disclosure relates generally to networked storage systems, and more particularly, in some embodiments, to subsystems for facilitating data storage and access in flash based networked storage systems.

BACKGROUND

The large amounts of information generated daily challenge data handling facilities as never before. In the context of today's information generation, data is being generated at rates perhaps thousands or tens of thousands of times greater than was the data-generation rate in the 1990s. Historically, large volumes of data sparked explosive growth in data communications. Responses to growing amounts of data generation centered on improving the movement of data based in increased transmission data rates to enhance throughput in communication channels. For instance, transmission pipelines grew from a few tens of megabits-per-second (Mb/s) transmission rates to several tens of gigabits-per-second (Gb/s) rates during the 1990s.

In the same period, typical storage devices, such as hard disk drives (HDDs), when amassed in sufficient numbers, might accommodate large volumes of data, but the rates at which data may be stored and retrieved have not scaled at the same rate as the volume of data stored on the devices has increased. Data access rates for HDDs are at similar orders of magnitude today as they were in the 1990s.

Fundamental storage subsystems have not integrated technology to enable scaling of effective data storage at the same rate that data generation is growing. Hence the challenge to systems handling large volumes of data is not likely to be alleviated by the combination of contemporary HDD technology with high-speed data transmission channels. In order to handle and manage big data, information processing facilities will be pressured to utilize larger volumes of storage with higher performance rates for capturing and accessing data.

BRIEF DESCRIPTION OF THE DRAWINGS

Some embodiments are illustrated by way of example and not limitation in the figures of the accompanying drawings in which:

FIG. 12 shows an example of a format for cache commands according to some embodiments.

FIG. 13 shows an example of a format for a completion status word according to some embodiments.

DESCRIPTION OF EMBODIMENTS

Introduction

Figure 1:
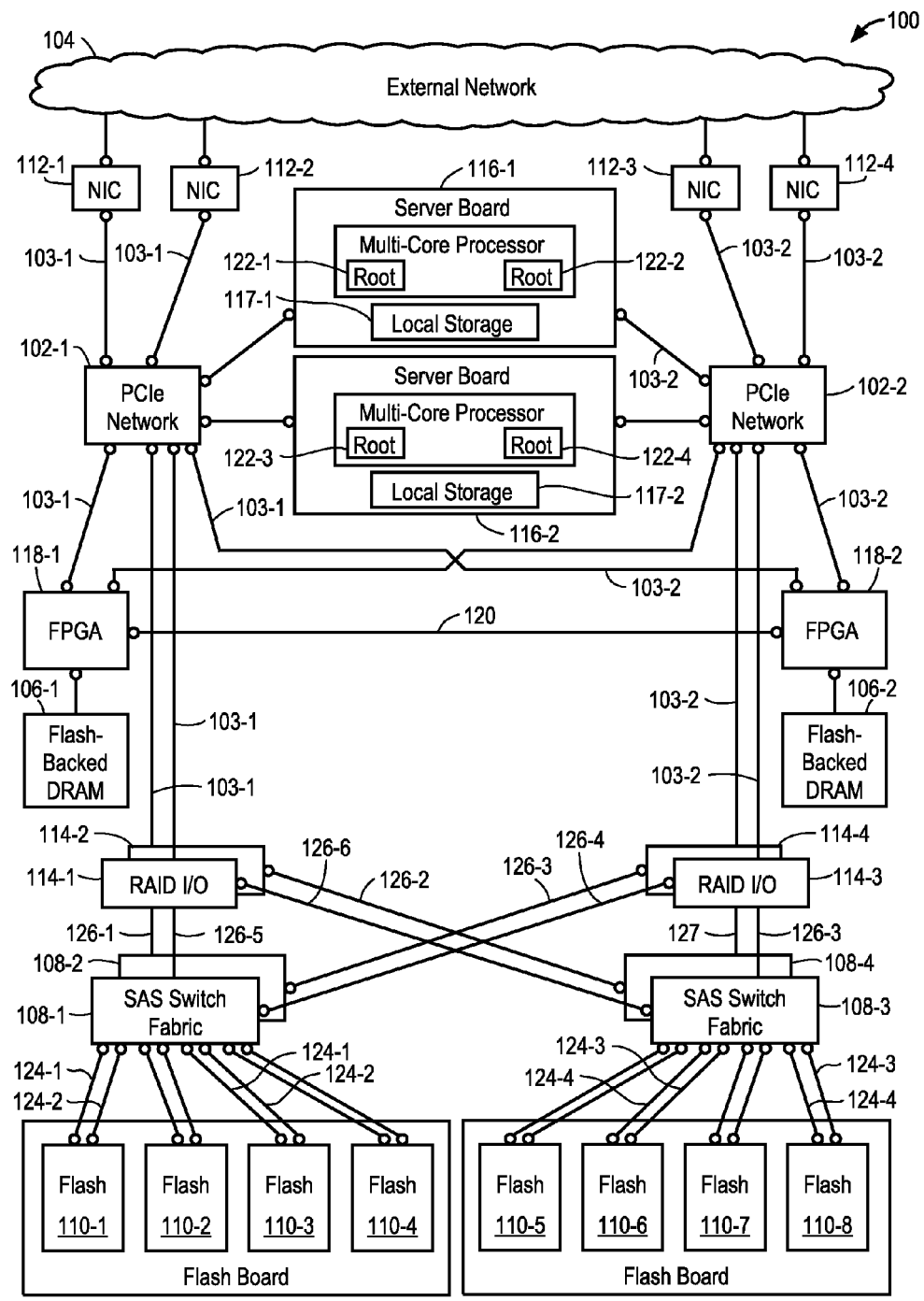
FIG. 1 is an illustrative schematic block diagram of a network storage system according to some embodiments.

The following description is presented to enable any person skilled in the art to create and use a computer system that provides high speed access to data storage devices, particularly Flash storage devices. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known data structures and processes are shown in block diagram form in order not to obscure the description of the invention with unnecessary detail. Identical reference numerals may be used to represent different views of the same item in different drawings. Flow diagrams in drawings referenced below are used to represent processes. A computer system is configured to perform some of these processes. The flow diagrams that represent computer-implemented processes include modules that represent the configuration of a computer system according to computer program code to perform the acts described with reference to these modules. Thus, the present invention is not intended to be limited to the embodiments shown, but is to be accorded the widest scope consistent with the principles and features disclosed herein.

System Overview

FIG. 1 is an illustrative schematic block diagram of a network storage system 100 in accordance with some embodiments. The system includes redundant components that permit recovery from component failures, for example. More specifically, the system 100 includes redundant first and second packet routing networks, referred to as the "routing networks" or "networks," 102-1, 102-2 that route packets between endpoints. First and second general purpose management processors 116-1, 116-2 are coupled as endpoints to each of the networks 102-1, 102-2. The first and second general purpose management processors 116-1, 116-2 may be implemented as one or more server boards and are associated with respective first and second non-transitory local memory devices (hereinafter "local memory devices" or "local memory") 117-1, 117-2. A plurality of Flash solid state (storage) drive (SSD) circuits (hereinafter "Flash circuits" or "Flash") 110-1 to 110-8 are coupled as endpoints to each of the routing networks 102-1, 102-2. Input/Output (I/O) circuits 112-1 to 112-4 are coupled as endpoints to each of the routing networks 102-1, 102-2 and act as communication interfaces between the routing networks 102-1, 102-2 and an external network 104. Storage access networks 108-1 through 108-4 provide access to the Flash circuits 110-1 through 110-8. Storage I/O interface circuits 114-1 to 114-4 are coupled as endpoints to each of the routing networks 102-1, 102-2 and act as communication interfaces between the routing networks 102-1, 102-2 and storage access networks 108-1 through 108-4. First and second packet processing circuits 118-1, 118-2 are coupled as endpoints to each of the network 102-1, 102-2. The first and second packet processing circuits are configured to impart one or more services to packets transported over the networks 102-1, 102-2. In some embodiments, the service imparted by the first and second packet processing circuits includes a cache service, and the first and second packet processing circuits 118-1, 118-2 are coupled to cache storage circuitry 106-1, 106-2, which in some embodiments includes Flash-backed DRAM circuits. In some embodiments, the service imparted by the first and second packet processing circuits includes one or more of encryption/decryption, duplication/de-duplication, compression/de-compression, replication, and snapshot, for example.

In accordance with some embodiments, the network "fabric" of the first and second packet routing networks 102-1, 102-2 is compliant with the PCI Express Base Specification (hereinafter "PCIe") released by the PCISIG (PCI Special Interest Group). See, PCI Express Technology, Comprehensive Guide to Generations 1.x, 2.x and 3.0, by M. Jackson and R. Budruk, 2102, Mindshare, Inc. PCIe specifies point-to-point bidirectional serial communication paths between endpoints over switches and connection lines. Information is transmitted in packets between endpoints over the routing networks 102-1, 102-2. A PCIe network includes serial connection lines 103-1, 103-2 commonly referred to as "links" that are capable of sending and receiving information at the same time. More specifically, information transmitted through either one or the other of the routing networks 102-1, 102-2 is encapsulated in packets that include routing information that indicates a source endpoint and a destination endpoint. According to the PCIe specification and in accordance with some embodiments, a link can include one or more serial transmit and serial receive connection pairs. Each individual pair is referred to as a "lane." A link can be made up of multiple lanes. Each lane uses differential signaling, sending both positive and negative versions of the same signal. Advantages of differential signaling include improved noise immunity and reduced signal voltage. Each endpoint device coupled to one or both of the routing networks 102-1, 102-2 includes "core" logic that implements one or more functions. A device that is a component of a typical PCIe compliant network can have multiple functions, up to eight in some embodiments, each implementing its own configuration space.

The first management processor 116-1 is used to configure the first packet routing network circuit 102-1 to provide point-to-point communication between components oper-ably coupled to it. The second management processor 116-2 is used to configure the second packet routing network circuit 102-2 to provide point-to-point communication between components operably coupled to it. In some embodiments, the first and second management processors 116-1, 116-2 configure point-to-point routing within the first and second packet routing networks. In other words, for a given pair of resource circuits, a fixed route among switches in the internal network circuits 102-1 or 102-2 is configured to transmit packets between the pair.

The PCIe specification specifies use of a root complex to configure a PCIe compliant network. A root complex includes interface circuitry (e.g., processor interface, DRAM interface) that couples a management processor and the rest of a PCIe network. Management processor 116-1 includes first and second root complexes 122-1, 122-2 that act as interfaces between processor 116-1 and network circuits 102-1 and 102-2. Management processor 116-2 includes second and third root complexes 122-3, 122-4 that act as interfaces between processor 116-2 and network circuits 102-1 and 102-2. The term "root" is used to indicate that the root complex is disposed at a root of an inverted tree topology that is characteristic of a hierarchical PCIe compliant network.

Figure 2:
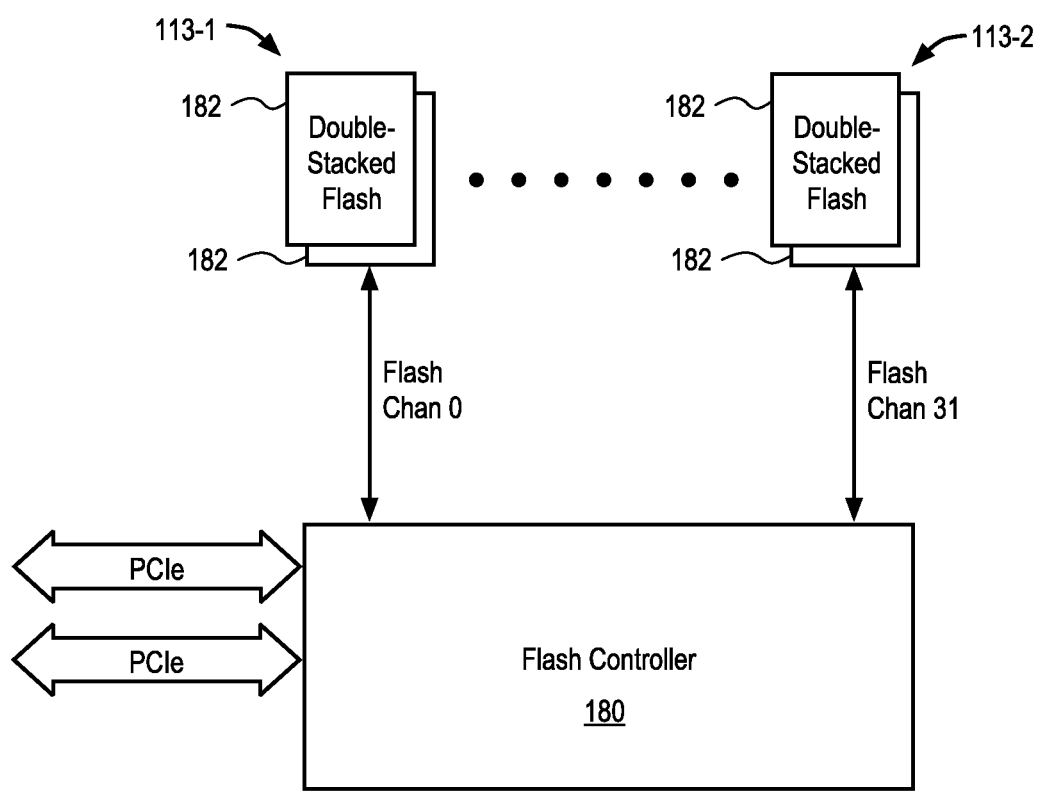
FIG. 2 is a block diagram showing a plurality of Flash storage modules coupled to a Flash memory controller, which in turn, is coupled to the first and second packet routing networks according to some embodiments.

FIG. 2 is an illustrative schematic diagram showing a plurality of Flash storage modules 113-1 to 113-N coupled to a Flash memory controller 180, which in turn, is coupled to the first and second packet networks 102-1, 102-2. It will be appreciated that for simplification of explanation, FIG. 1 shows the system 100 with only a few representative Flash circuits 110-1 to 110-8. However, in some embodiments, a system 100 can include a large number "M" of Flash endpoints, such as two-hundred Flash endpoints for example. Moreover, as shown in FIG. 2, in some embodiments each endpoints 110-1 to 110-N can include a double stacked Flash storage module that includes multiple individual Flash integrated circuits (ICs) 182 arranged on opposite surfaces of a printed circuit board (PCB) (not shown). In accordance with some embodiments, the Flash circuit modules 110-1 to 110-N share the same form factor, and in some embodiments, the Flash circuit modules' form factor is compliant with a dual inline memory module (DIMM) format. A memory controller 180 is coupled to the routing networks 102-1, 102-2 and manages the flow of data going to and from the Flash ICs on the Flash storage module of the endpoints.

Referring again to FIG. 1, the I/O interface circuits 112-1 to 112-4 provide high-speed connections between the external network 104 (e.g., InfiniBand, Fibre Channel, and/or Ethernet) and the first switch network circuitry 102-1, 102-2. The I/O circuitry provides protocol conversion, including packet format conversion, during high-speed data communication between the external network 104 and the first switch network circuitry 102-1, 102-2. In some embodiments, the external network I/O interface circuits 112-1 to 112-4 are implemented as network interface cards commonly referred to as NICs, which include circuits that are configured to transform packets to suitable formats as they pass between the external network 104 and the routing networks 102-1, 102-2.

The storage I/O interface circuits 114-1 to 114-4 manage the distribution of data across the Flash storage circuits 110-1 to 110-8. In some embodiments, the storage I/O interface circuits are configured to implement a file system used to control how data is stored in and retrieved from storage devices. In some embodiments, the storage I/O interface circuits 114-1 to 114-4 are implemented as RAID controllers configured to organize data across multiple storage devices, such as Flash storage devices 110-1 to 110-8. The term RAID refers to data storage schemes that combine multiple disk drive components into a logical unit for the purposes of data redundancy and performance improvement. Persons skilled in the art will appreciate that Flash storage, sometimes referred to as solid-state drive (SSD) is a data storage device using integrated circuit assemblies as memory to store data persistently. Each of the storage access switch networks 108-1 to 108-4 provides point-to-point connections 124-1 to 124-4, respectively, using a serial protocol that moves data to and from the Flash storage devices 110-1 to 110-8. In some embodiments, the storage access switch networks 108-1 to 108-4 use a protocol that includes the SAS (Serial Attached SCSI) protocol. In general, according to the SAS protocol, there are three types of SAS devices: initiators (e.g., RAID controllers), target storage devices (e.g., Flash circuits), and expanders. An initiator device attaches to one or more target storage devices, to create a SAS domain. In some embodiments, the storage I/O interface circuits, implemented as RAID controllers, act as SAS initiators. In accordance with some embodiments, the Flash storage circuits 110-1 to 110-8 act as SAS targets. Using expanders (e.g., low-cost, high-speed switches), the number of targets attached to an initiator can be increased to create a larger SAS domain.

Communication paths 126-5, 126-6 couple storage I/O interface circuit 114-1 to exchange data with storage access switch networks 108-1 and 108-3. Communication paths 126-1, 126-2 couple storage I/O interface circuit 114-2 to exchange data with storage access switch circuits 108-2 and 108-4. Communication paths 126-3, 126-4 couple storage I/O interface circuit 114-3 to exchange data with storage access network circuits 108-3 and 108-1. Communication paths 126-7, 126-8 couple storage I/O interface circuit 114-4 to exchange data with storage access switch networks 108-4 and 108-2. Thus, all Flash circuits 110-1 to 110-8 are accessible via the first internal network circuit 102-1 via the storage I/O interface circuits 114-1, 114-2 coupled to it, and all Flash circuits 110-1 to 110-8 are accessible via the second internal network circuit 102-2 via the storage I/O interface circuits 114-3, 114-4 coupled to it.

In some embodiments, the first and second packet processing circuits 118-1, 118-2 are implemented as field programmable gate array (FPGAs). FPGA circuitry often can impart services with less latency delay, and therefore, faster than a typical general purpose management processor, for example, since the programmable logic can be programmed in advance to dedicate specific hardware circuitry to provide the services. Programmable hardware logic such as FPGA circuitry often can perform operations faster than, for example, a general purpose processor which often uses software interrupts to transition between different operations. Alternatively, in accordance with some embodiments, one or more of the packet processing circuits can include a special purpose processor, an application specific integrated circuit (ASIC), or an array of processors configured to run software to perform a given service.

The first and second packet processing circuits 118-1, 118-2 of FIG. 1 also are directly coupled to each other so that the same data can be cached at both. In some embodiments, a communication path 120 coupling the first and second programmable logic circuits includes a circuit connection compliant with a high speed network communication protocol. In some embodiments, the communication path 120 complies with the Ethernet protocol.

The first programmable logic circuit 118-1 is operably coupled to first cache storage circuitry 106-1. The second programmable logic circuit 118-2 is operably coupled to second cache storage circuitry 106-2. In some embodiments, the first and second cache circuits include DRAM circuits. More particularly, in some embodiments the first and second cache circuits include Flash-backed DRAM circuits in which Flash circuits are coupled to stored data persistently in the event of failure of a corresponding DRAM circuit.

Cache Memory

Figure 3:
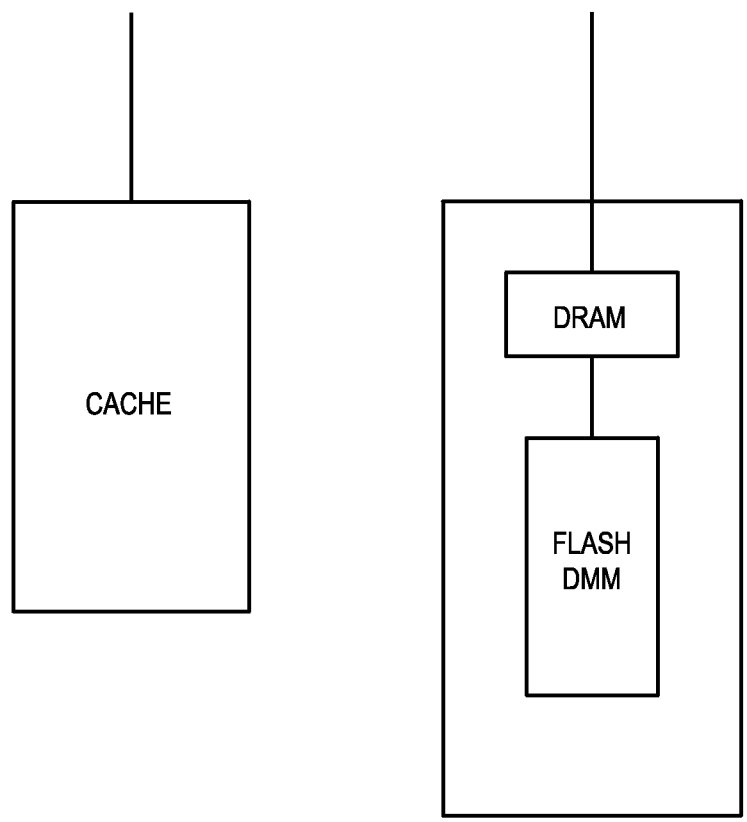
FIG. 3 is a block diagram showing a dual inline memory module containing DRAM and flash memory, as may be used in example embodiments.

Cached data and cache metadata can be stored in Flash backed-up DRAM included in cache storage circuitry 106-1 and 106-2. FIG. 3 is a block diagram illustrating a dual inline memory module (DIMM) containing DRAM and flash memory, which in accordance with some embodiments, can be plugged into a standard DDR3 DIMM socket. In some embodiments, during operation the module behaves similar to a standard DDR3 DRAM DIMM, however, upon the occurrence of the events specified below, data is copied between the DRAM and flash. The entire contents of on-board DRAM are written to flash upon the occurrence of any of the following:

If configured to do so: A drop in supply voltage is detected by an on-board circuit. Super-capacitors may supply power to the Cache module to complete this operation.

A SAVE command is received via the I2C interface on the DIMM socket.

An interrupt is received via a pin on the DIMM socket.

The contents of flash are written to DRAM upon occurrence of any of the following events:

If configured to do so: After power up if a valid saved image is detected in flash.

A RESTORE command is received via the I2C interface on the DIMM socket.

Reconfigurable Circuitry

The packet processing circuits 118-1 and 118-2 of FIG. 1 can be configured to include a cache controller to provide cache management services. The circuitry of a cache controller may include a state machine to perform the functions described. This offloads cache control functions to hardware from software to increase cache speed. A cache controller may also be capable of accommodating other hardware accelerators for off-loading CPU software functions to hardware. Some examples of these functions include encryption/decryption, duplication/de-duplication, compression/decompression, processing, replication, and snapshot.

The software driver (e.g., of a management processor) and cache controller allow for 1:1 redundancy of data storage between cache memory and system flash memory. Data redundancy may also be applied to the cached data by having two cache controllers operate together to mirror the cache data. If one cache controller fails the other cache controller can operate independently, and cached data is preserved without any data loss.

Figure 4:
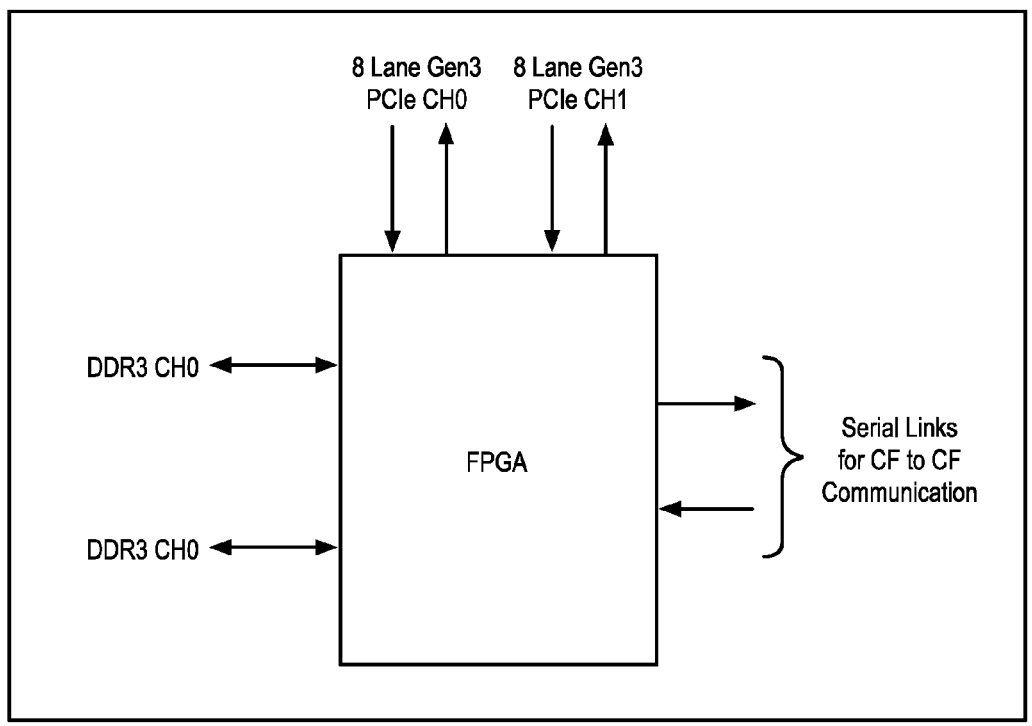
FIG. 4 is a block diagram showing an example of interfaces to a cache controller according to some embodiments.

FIG. 4 shows an example of interfaces to a cache controller. A cache controller can include two PCIe interfaces, PCIe CH0 and PCIe CH1. A cache controller can appear as a PCIe end-point on two RCs (one end-point per RC). One cache controller and one PCIe switch may reside on one switch card or switch board of a switch fabric. Hosts on the server boards can communicate with the cache controllers via the PCIe switches. A PCIe interface may provide a raw bandwidth of 64 gigabits/sec (64 Gbps). Channel 0 (PCIe CH0) can be electrically coupled to a PCIe switch local to the switch board of the cache controller and Channel 1 (PCIe CH1) can be electrically coupled to a PCIe switch remote from the switch board of the cache controller. A cache controller can include a serial link for inter-cache controller communication between switch boards. In an example, a serial link can include four lanes and have aggregate bandwidth of 10 Gbps.

Each cache controller may include an interface to DRAM that includes the storage space of the cache modules. In the example shown in FIG. 4, the cache controller includes two interfaces labeled DDR3 CH0 and DDR3 CH 1. Two dual in-line memory modules (RDIMMs) can be connected to the cache controller for data and cache table storage. In certain variations, one RDIMM can store 8 gigabytes (8 GB). Other sizes are possible such as 16 GB or 32 GB for example.

Figure 5:
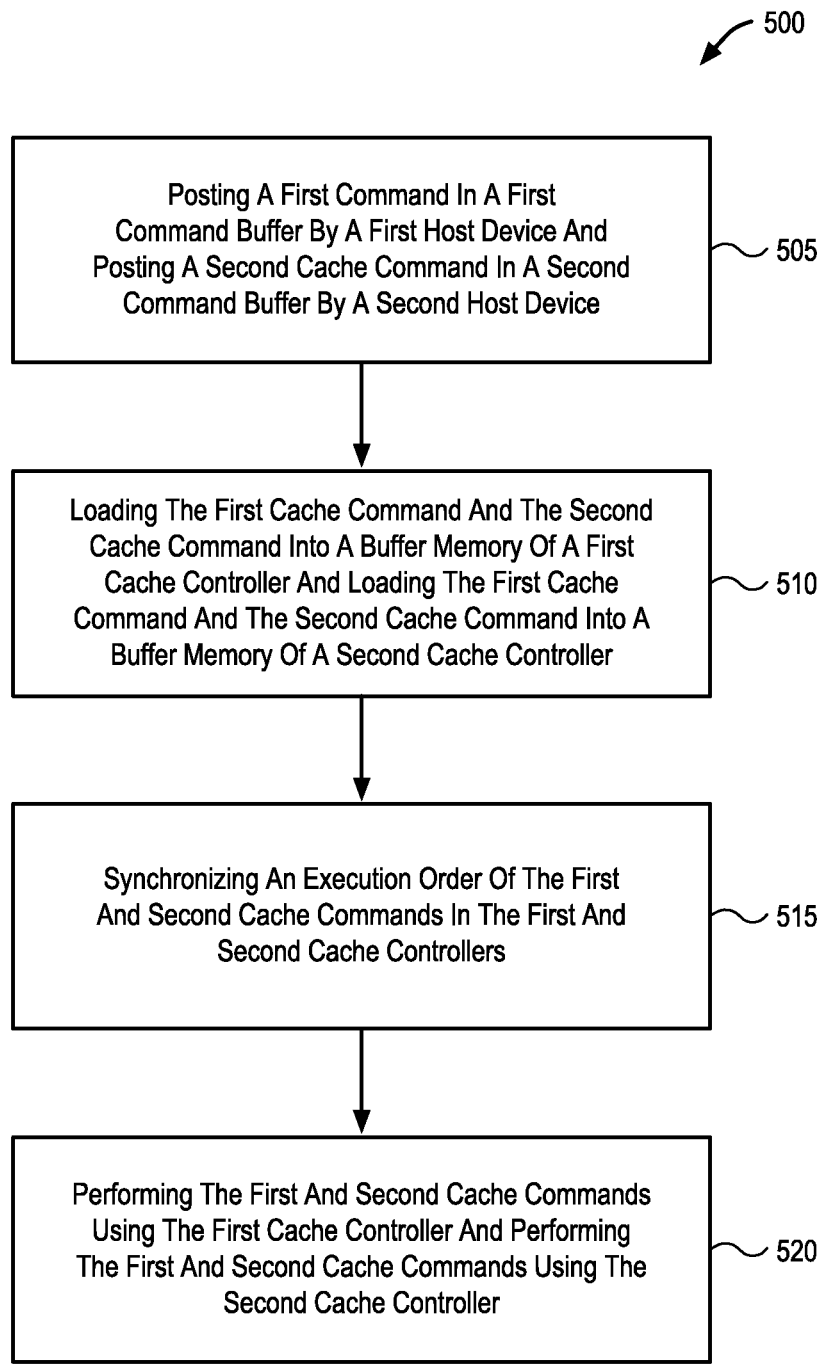
FIG. 5 shows a flow diagram of an example of a method of managing access to cache memory using two cache controllers according to some embodiments.

FIG. 5 shows a flow diagram of an example of a method 500 of managing access to cache memory using two (e.g., redundant) cache controllers. Each cache controller performs cache management tasks for a cache memory. The cache memory may include one or more cache modules 106-1 and 106-2 shown in FIG. 1. At block 505 of FIG. 5, a first cache command is posted in a first command buffer by a first host device and a second cache command is posted in a second command buffer by a second host device. A host device may be a management processor 116-1 and 116-2 in FIG. 1 and a cache command may be posted by a host executing at the management processor. The command buffers may reside in the host devices and can be separate from the cache controller.

Referring again to FIG. 5 at block 510, the first cache command and the second cache command are loaded into a buffer memory of the first cache controller, and the first cache command and the second cache command are loaded into a buffer memory of the second cache controller. In some examples, the writing of the command buffers initiates the performance or action of a cache controller. At block 515, the order of execution of the first and second cache commands is synchronized in the first and second cache controllers. The synchronizing of the order of execution of the first and second cache commands can include communicating an indication between the first and second cache controllers that the loading of the first and second cache commands is completed. The synchronizing can include communicating the size of the loaded cache commands between the first and second cache controllers. This information may be used by the two cache controllers to coordinate the setting of a pointer for the command buffer memories.

At block 520, both the first and second cache commands are performed using both the first cache controller and the second cache controller. The contents of the data storage of the first cache memory and the second cache memory are substantially identical after the first and second cache commands are performed by both of the first and second cache controllers. This results in redundancy of the cache memory contents. If one cache memory fails or cache data is otherwise corrupted, a duplicate exists. The non-failing cache can operate independently and cached data is preserved without loss of data.

Figure 6:
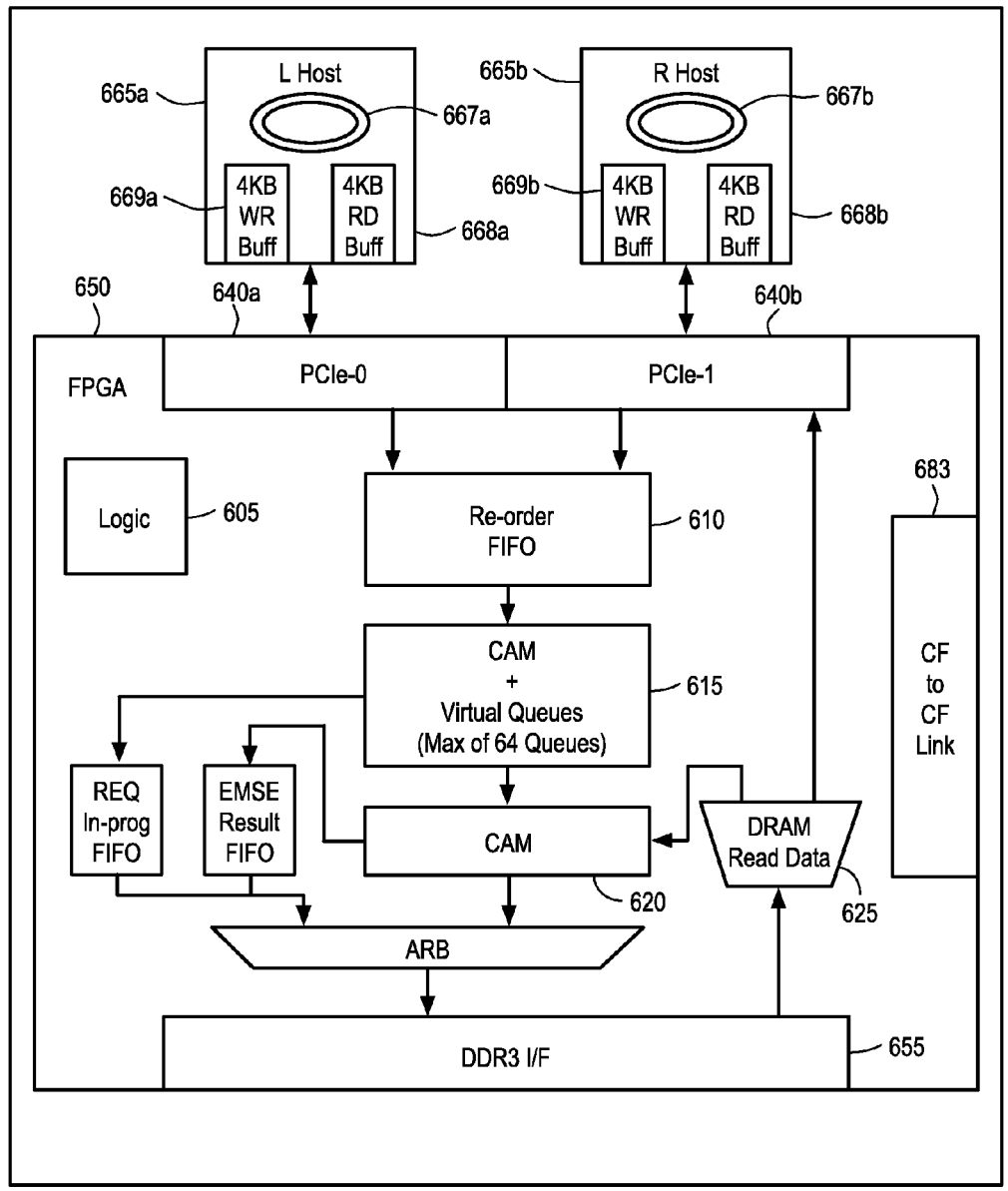
FIG. 6 is a block diagram of portions of an example of a cache controller according to some embodiments.

FIG. 6 shows a block diagram of portions of an example of a cache controller 650. Also shown are representations of a left host device 665a and a right host device 665b. An example of a host device is a management processor 116 in FIG. 1. The designation left and right are arbitrary and the designation could also be, among other things, a number such as host device 0 and host device 1. The host devices also show representations of a cache command memory 667a,b or command circular ring buffer, read data buffers 668a,b and write data buffers 669a,b.

In the example shown in FIG. 6, each cache controller 650 includes a cache memory interface 655 (labelled DDR3 I/F for "DDR3 DRAM DIMM Interface"). As shown in the example of FIG. 4, a cache controller 650 may have multiple interfaces to cache memories or cache modules. The cache controller 650 also includes an inter-cache controller communication link 683. The inter-cache controller communication link 683 may be a serial link that provides bidirectional communication with the other cache controller. The cache controller 650 includes two peripheral interfaces. A first peripheral interface 640a is used to communicate with the first host device 665a and a second peripheral interface 640b is used to communicate with the second host device 665b. In some variations, the peripheral interfaces 640a,b are PCIe interfaces. A cache controller 650 and a routing network 102 of FIG. 1 can reside on a switch card, and hosts running on a management processor 116 communicate with the cache controller via the routing network. The first peripheral interface (PCIe-0) can be connected to a first host device via a PCIe interface local to the cache controller 650 and the second peripheral device (PCIe-1) can be connected to the second host device via a PCIe interface remote from the cache controller 650.

The cache controller 650 can include logic circuitry 605. In some variations, the logic circuitry includes hardware circuits that implement a state machine. The logic circuitry may be reconfigurable or non-reconfigurable. The logic circuitry controls operation of the cache controller 650. For instance, the logic circuitry may load a cache command from the cache command memory of the first host device and load a cache command from a cache command memory of the second cache controller. The logic circuitry may trigger the pulling and execution of a cache command when an indication is received that a cache command is loaded into at least one of the cache command memories 667a,b.

Each host (e.g., left (L) host and right (R) host) posts cache commands to its own command ring buffer within memory of the host device. As the host posts cache commands to the command ring buffer, it updates a tail pointer of the ring to a register within the cache controller memory space. Each cache controller can include a first-in-first-out memory buffer 610 (FIFO) to store cache commands loaded or pulled from the first and second host devices. The cache controller 650 pulls cache commands from the command ring buffers into its on-board FIFOs. This can be done as memory-reads (MEMRD) to the host memory, with the length of the MEMRD command set to the PCIe maximum transmission unit (MTU) or the number of commands on the ring, preferably whichever is less. After a "command pull," the cache controller 650 waits for the other cache controller to perform the same command pull. The logic circuitry 605 can be configured to reorder cache commands received from the hosts and stored in the FIFO of the cache controller to match an execution order of commands of the FIFO of the other cache controller. This ordering ensures that the same sequence of cache command is performed by the cache controllers for commands from both of the left and right hosts.

The cache controller may include a first content addressable memory (CAM) 615 internal to the cache controller 650. The cache controller may include a second CAM 620 including associative memory configured to describe the contents of the cache memory. The first CAM is used to store one or more queues containing cache commands. These queues can be viewed as Virtual Queues (VQs) that include a sequence of cache commands for a specified cache entry index for the cache memory. After re-ordering in a FIFO, cache commands are placed within the VQs based on the command cache key. A cache key is used to locate an entry in the cache and is included in field of a command word to indicate the cache key used in the cache operation. If the command is a Cache Query command, the Cache Key field includes the number of entries returned by the Cache Query command and an index of the last returned valid cache entry. A cache key may be assigned its own queue, and the queues may be serviced in a round-robin fashion. After the cache keys are assigned to queues, the cache command keys of the received commands are matched to the keys assigned to the queues. If a match is found for the key of the received command, the key is placed in the matching queue. If no match is found for a key of a received command, a new queue is created if space allows. When all commands of a queue are completed, the queue is deleted. The first CAM 615 can be relatively small (e.g., large enough to hold 256 command entries or 64 queues). The second CAM 620 can be relatively large (e.g., 4 million entries) and can be used to store metadata for the cache memory contents.

After a cache command operation is fully completed and data is written to either DRAM or host memory, the cache controller may write a status word to the host memory indicating the status of the completed command (an error status can be reported at this stage to indicate a failure during command execution). Once each host receives the status word from both cache controllers, it can free the data buffer memory within its memory space. Although only one cache controller returns cache read data to the host for cache read command, both cache controllers should return the same completion status indication to the host. It is an error condition when only one cache controller returns completion status or if the returned completion statuses are not the same.

Figure 7:
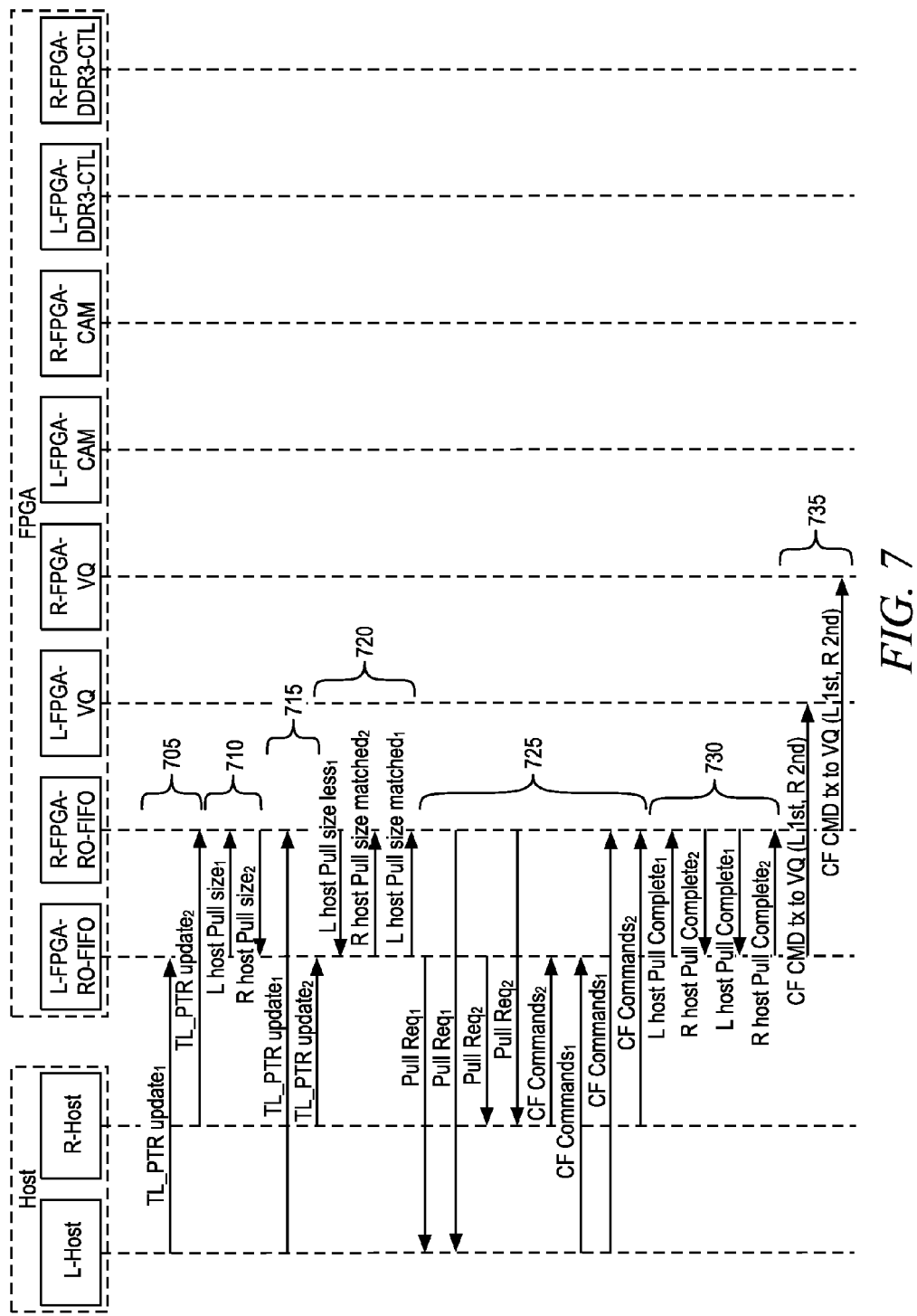
FIG. 7 shows a diagram of an example of a sequence of communications for loading cache commands in cache controllers according to some embodiments.

FIG. 7 shows a diagram of an example of a sequence of communications for loading cache commands in cache controllers. The Left Host (L-Host) posts cache commands to its command ring buffer and the Right Host (R-Host) posts commands to its command ring buffer. At 705, the Left Host updates a tail pointer (TL_PR update) of the command ring buffer to a register within the left cache controller memory space (L-FPGA-RO-FIFO) and Right Host updates a tail pointer of the command ring buffer to a register within the right cache controller memory space (R-FPGA-RO-FIFO). The tail pointers may be updated using a peripheral interface between the hosts and the cache controllers. The sequence shows the Left Host sending a tail pointer first. This may happen when the Left Host is given priority over the Right Host. At 710, the size of the loaded cache commands is communicated between the left and right cache controllers. This communication may be implemented using a serial link between cache controllers.

Each host posts cache commands to the companion cache controller. At 715, the Left Host updates a tail pointer (TL_PR update) of the command ring buffer to a register within the right cache controller memory space (R-FPGA-RO-FIFO) and Right Host updates a tail pointer of the command ring buffer to a register within the left cache controller memory space (L-FPGA-RO-FIFO). At 720, the size of the cache commands is communicated between the left and right cache controllers and matched by the cache controllers.

At 725, each cache controller sends a command pull request to each host and cache commands are pulled from each host device buffer memory by each cache controller. At 730, an indication the completion of loading of the first and second cache commands is communicated between the left and right cache controllers. At 735, the cache controller transfers the cache commands into virtual queues. The cache commands are shown queued by the left cache controller first and right cache controller second.

The cache commands include cache read (CR) and cache write (CW) commands. FIG. 6 shows read data buffers 668a,b for the host devices 665a,b respectively. For each cache read operation, 4 kilobytes (4 KB) of data is read from the DRAM and returned to the host memory. The block 4 KB is only one option for the block read size and other block sizes are possible. In some examples, the cache controller 650 includes direct memory access engine 625 (DMA). The block of read data is returned to the host memory from the DRAM by the DMA engine. A CR command includes one or more bits to indicate which cache controller will return the read data. If there are two cache controllers designated as left and right, this may include one L/R bit to designate left or right. This prevents both cache controllers from writing the same data to the same read buffer in host memory. Preventing the redundant write preserves the bandwidth at the PCIe and DRAM interfaces.

Figure 8:
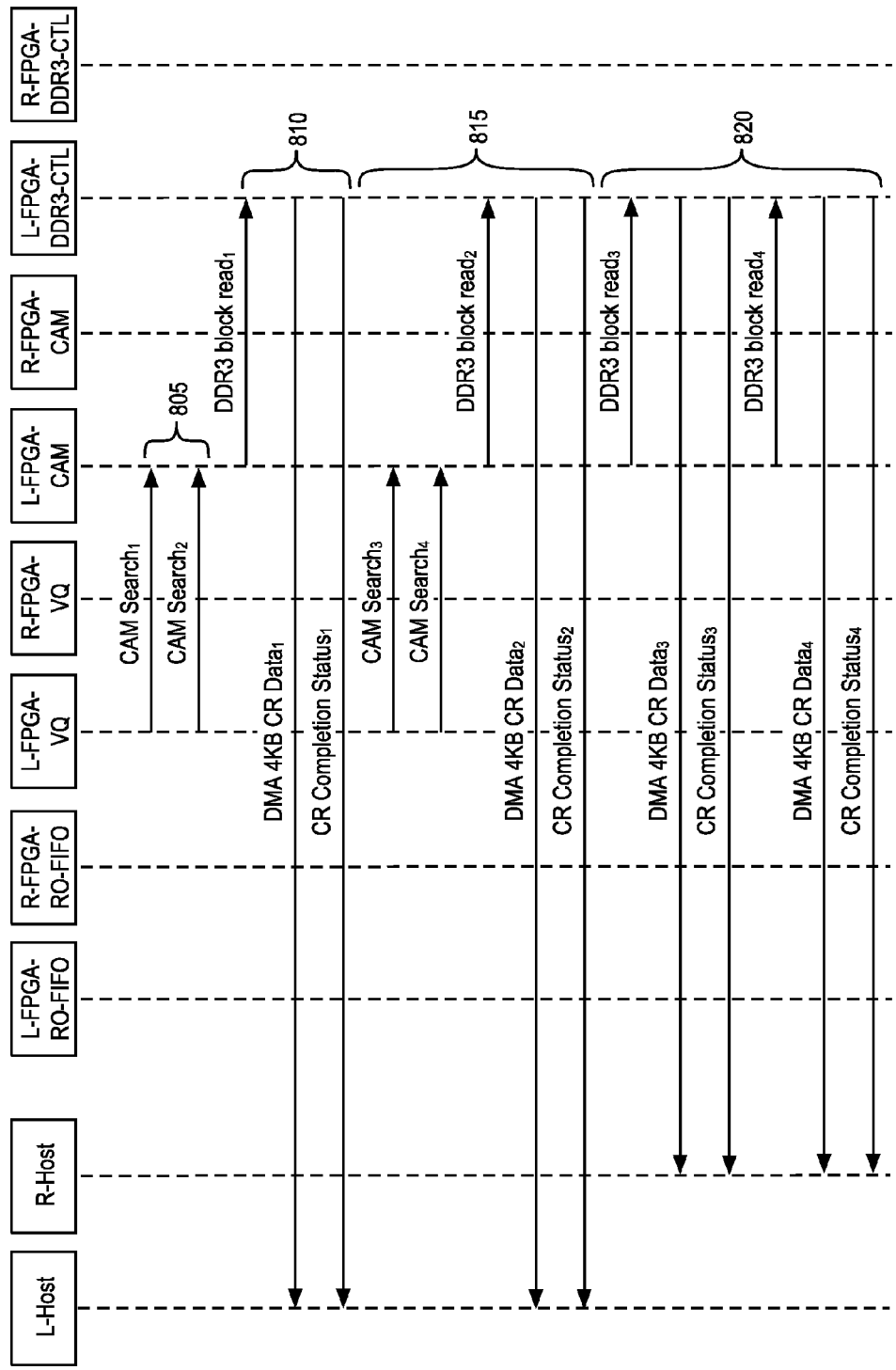
FIGS. 8 and 9 show diagrams of examples of a sequence of communications for cache read commands performed by a cache controller according to some embodiments.

FIG. 8 shows a diagram of an example of a sequence of communications for cache read commands performed by the left cache controller. The example shown involves a cache hit for a CR command from the left host. At 805, the CR command is executed out of the virtual queue (e.g., in the first CAM 615 of FIG. 6) and CAM is searched (e.g., the second CAM 620) to determine the status of the data in the cache memory. At 810, a block read of cache memory is performed by the left cache controller. The block read can be performed using the DDR3 I/F to DRAM. A block of data (e.g., a 4 KB block) is transferred to buffer memory (e.g., read buffer memory 668a in FIG. 6) and a status word is written to memory of the Left Host. At 815, a second block read is performed for the Left Host. The example in FIG. 8 also includes a CR command for the Right Host, and shows two block reads 820 performed by the left cache controller and transferred to memory of the Right Host together with status words for the read operations.

Figure 9:
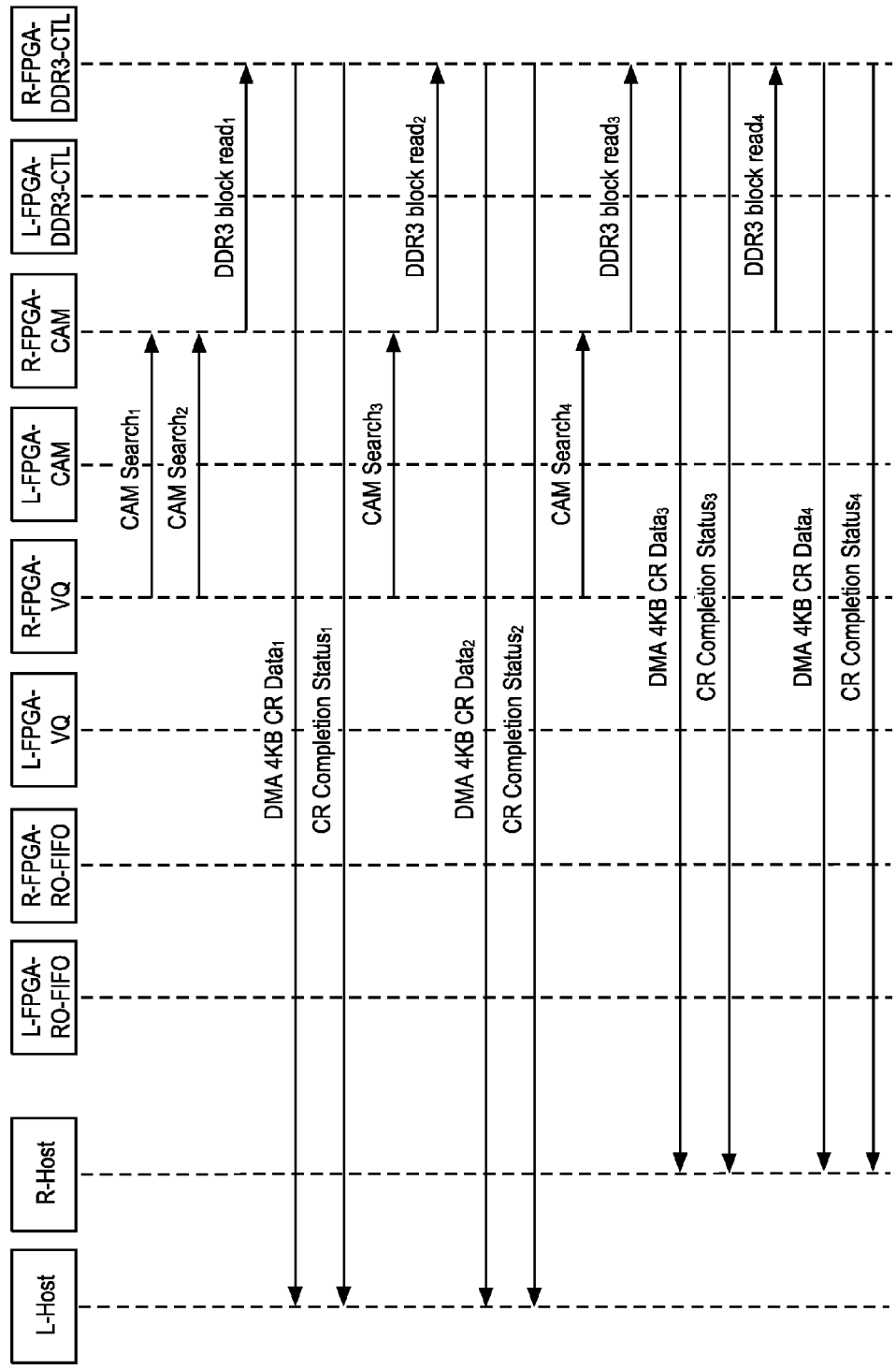

FIG. 9 shows a diagram of an example of a sequence of communications for cache read commands performed by the right cache controller. As explained above, both cache controllers load the cache commands from each of the Left and Right hosts, and both cache controllers perform the commands. Only one cache controller may return cache read data to a host for a cache read command, but both cache controllers return a completion status word.

Returning to FIG. 6, write data buffers 669a,b are shown for host devices 665a,b respectively. Cache write data can be pre-fetched from the write data buffers 669a,b. In certain variations, the pre-fetching is performed by the DMA 625. Pre-fetching ensures no waiting at the DRAM interface for a PCIe MEMRD operation. The write data is written to the DRAM once the DRAM address is obtained from second CAM 620.

Figure 10:
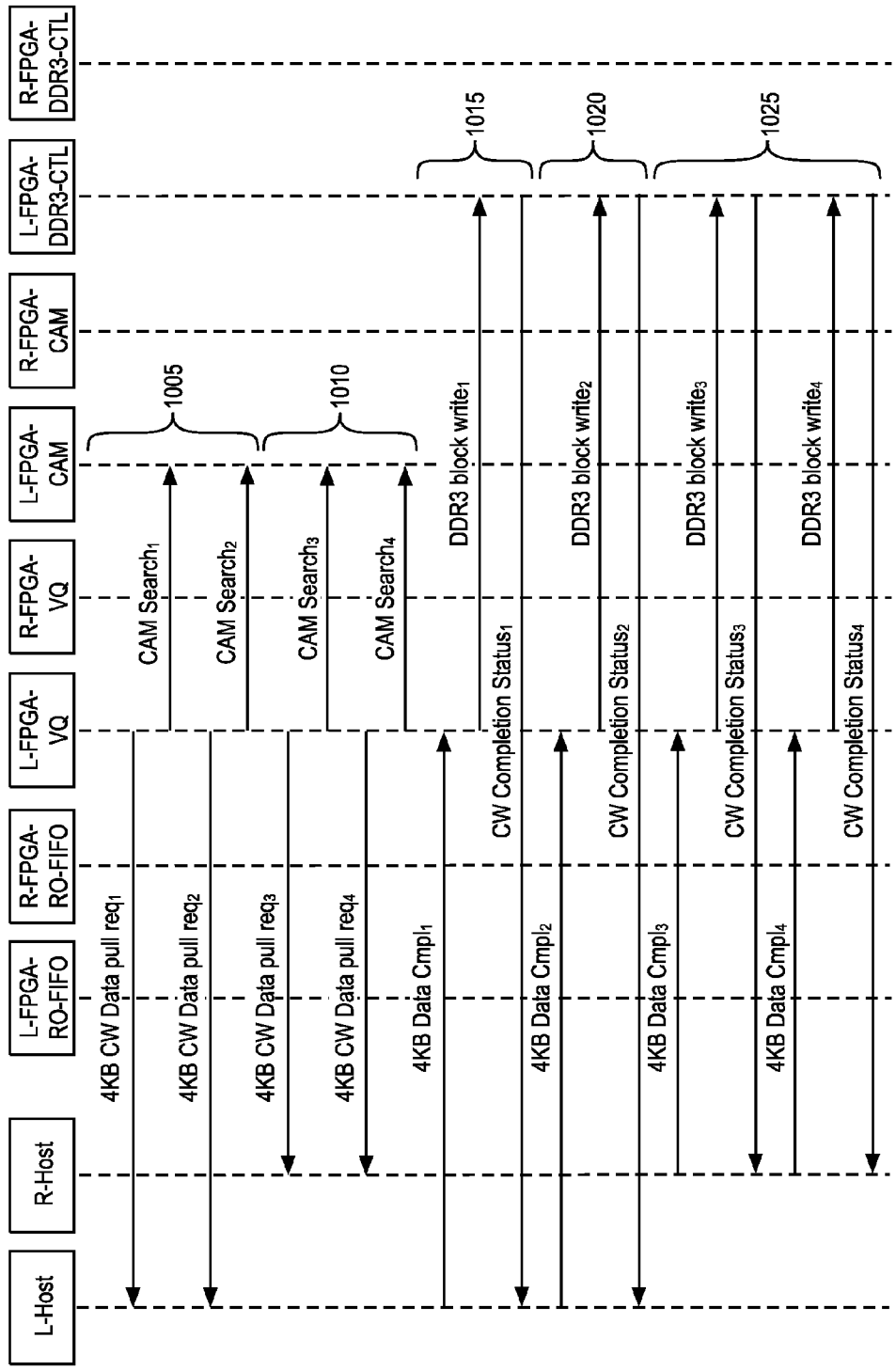
FIGS. 10 and 11 show diagrams of examples of a sequence of communications for cache write commands performed by a cache controller according to some embodiments.

FIG. 10 shows a diagram of an example of a sequence of communications for cache write (CW) commands performed by the left cache controller. After cache commands are pulled from the hosts and transferred from the FIFOs to the virtual queues, a data pull request originates from a virtual queue. At 1005, two data pull requests are sent to the Left Host and CAM is updated accordingly. Each request is for a block of data (e.g., a request for 4 KB of data). At 1010, data pull requests are sent to the Right Host. At 1015, a block of data is pulled by the left cache controller from memory of the Left Host. The data is written to DRAM of cache memory and a completion status word is returned to the Left Host. At 1020, a second block of data is pulled by the left cache controller from memory of the Left Host and a second completion status word is returned to the Left Host when the data is written to cache memory. At 1025, two blocks of data are pulled by the left cache controller from the Right Host. The data is written to cache by the left cache controller and completion status is returned to the Right Host.

Figure 11:
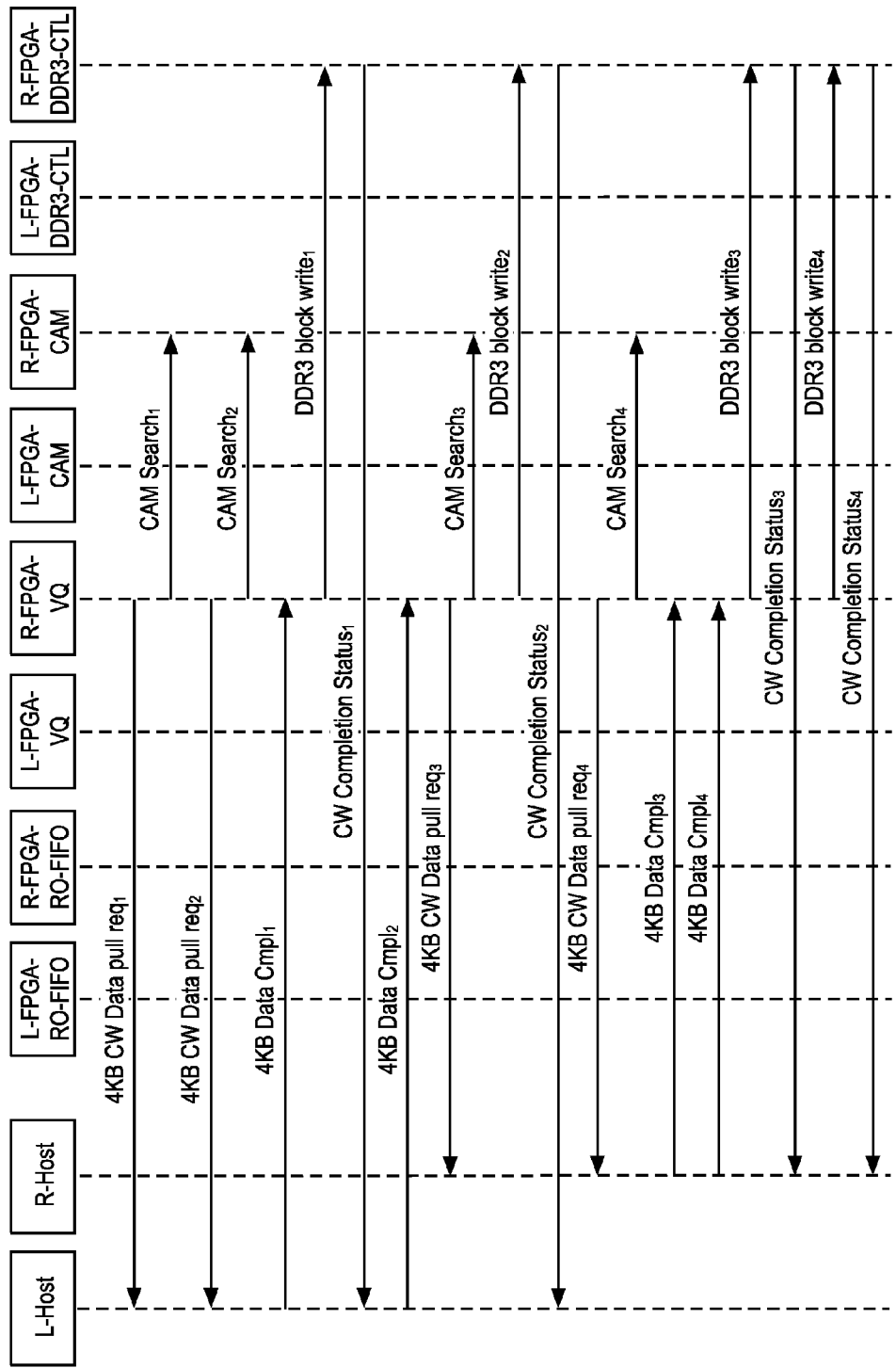

FIG. 11 shows a diagram of an example of a sequence of communications for CW commands performed by the right cache controller. Cache write commands from the Left Host and the Right Host are performed by both the left and write cache controllers. This results in duplicate cache data in the cache memories.

Cache Commands

FIG. 12 shows an example of a format for cache commands. The field labeled CMD can include 4 bits and designates the command as one of the following: Cache Read (CR), Cache Read with Modify (CRM), Cache Write (CW), Cache Modify (CM), Cache Evict (CE) and Cache Query (CQ). The field labeled L/R bit designates the cache controller that returns the data. For example, if the value of the bit is "0," read data is returned to the host by the left cache controller, and if the value of the bit is "1," read data is returned to the host by the right cache controller. The field can be expanded if there are more than two cache controllers that can return cache data.

A cache command can include a dirty bit (labeled DRTY in FIG. 12). A cache write command sets the state of the dirty bit in the cache metadata to the state of the DRTY bit in the command. The DRTY bit can be used to properly implement cache access synchronization by the multiple hosts and redundant cache controllers. This concept can be illustrated by the following scenario. Assume the Left Host has just completed a read from the flash memory as a result of a cache miss. Also assume the Right Host has received a write request corresponding to at least a portion of the same data as the Right Host from an application program, and the Right Host determines to write the data to cache memory. The Right Host writes the data to cache memory with DRTY bit active (e.g., set to one) in the cache command. The Left Host may try to retain a copy of the data from flash memory by writing the data to cache. It will attempt a cache write with the DRTY bit set inactive (e.g., set to 0). If allowed to go through, the cache write operation from the Left Host would cause the data from the Right Host to be lost. Consequently, the cache controller will prevent the cache write by the Left Host. The cache controller may return a completion status that indicates the entry was found but not written.

The cache command can include a Cache Write Mask filed (labeled CW-MSK in FIG. 12) that can comprise 8 bits and is used for disabling writes to blocks of 512 bytes when data is written to cache memory during execution of the Cache Write command.

The cache command can include a sequence field (labeled SEQ#) that can comprise 17 bits and is used as a pointer to the original command. Software can use the field as an index into the cache command ring buffer. The Eviction Candidate bit field (labeled EC) indicates a cache entry has been tagged for eviction. The Eviction Candidate bit can only be set to an active state or 1 by a cache read modify command (described below). If a cache write command is executed by a cache controller the Eviction Candidate bit is set to an inactive state or 0. The "Cache Key" or "Cache Query Index and Entry Count" field can comprise 96 bits. As used by all commands except cache query command, the Cache Key filed indicates the Cache Key used in the cache operation. For the Cache Query command, this field indicates the starting entry index and maximum number of valid cache entries to be returned by the cache controller to the host.

The Host Buffer Address field can comprise 64 bits and indicates the physical address of the Host Data buffer in the host memory. It can be used as the address of the data for the cache block transfers to and from the host memory. The Host Status Address can comprise 32 bits and is used as an offset for the status information once a cache command is completed. The Host Status Address can be added to the Host Buff Address to form a 64 bit physical address within the host memory. The Cache Key Aging Alias can comprise 32 bits and is used in an algorithm to determine cache eviction.

Steps taken by a cache controller are described below for cache commands including a cache read, a cache read modify, cache write, cache modify, cache evict, and cache query. For a Cache Read (CR) command, if there is a hit on the data in cache (a match in a cache tag), the cache controller will perform a search of the corresponding cache metadata in CAM. The address of the data is returned by the CAM response and the data is then read from cache memory (DRAM). The data may be read as a block of data by a DMA bock transfer to the host memory. The cache controller returns the completion status of the operation to the host memory. If there is a cache miss, the cache controller returns the completion status with an indication of the miss to the host memory.

The Cache Read Modify (CRM) command is similar to the Cache Read command except that it will set the Eviction Candidate bit in the cache metadata. The host originating the command does not have to be the "owner" of the read cache entry to issue this command (i.e., either host can issue this command). This command is the only command which can set the EC bit to an active state (e.g., set the EC bit to a 1).

For a cache write (CW) command, the cache controller performs a pre-fetch of a block of write data (e.g., 4 KB) from the host memory. The cache controller also looks for a hit on the key in second CAM 620. The current state of the DRTY bit within the cache metadata is compared with the state of DRTY bit within the cache command. If the DRTY bit is set to 1 in the cache metadata and set to 0 in the cache command, the cache controller will return a "Failed" status. Otherwise, the DRTY bit in the cache metadata is set to the same state as the DRTY bit in the cache command and the pre-fetched block of data is written to the DRAM at the address obtained by CAM search command.

In the case of a cache miss, the cache controller inserts the cache key in the cache metadata and sets the DRTY bit and the ownership bit of the cache line in the cache metadata. The DRAM address of the data is obtained as part of the CAM response and the cache controller writes the pre-fetched block of data to the DRAM at the address given by CAM. The cache controller then sends the command completion status to the host memory to indicate buffer can be freed. The command completion status can be sent using the cache controller DMA.

For a Cache Modify (CM) command, the cache controller looks for a hit on the data in cache. If there is a cache hit, the cache controller performs a search of the cache metadata in CAM. If the Eviction Candidate bit is set then the DRTY bit of the metadata for the cache entry is cleared; otherwise the cache controller returns a "Failed" status. In response to the cache hit, the cache controller returns a cache completion status of "hit" to the host memory. In the event of a cache miss, the cache controller sends a cache completion status of "miss" to the host memory. The command completion status can be sent using the cache controller DMA.

For a Cache Evict (CE) command, the cache controller looks for a hit on the data in cache. If there is a cache hit, the cache controller performs a search of the cache metadata in CAM. If the host issuing the CE command is the owner of the cache entry and the Eviction Candidate bit is set for the entry, the cache controller deletes the cache entry and the cache key. This is done regardless of the state of the DRTY bit in the metadata. A programming option can be provided to disable the checking of the ownership bit before deleting the cache entry. In response to the cache hit, the cache controller returns a cache completion status of "hit and success" or "fail" to the host memory. In the event of a cache miss, the cache controller sends a cache completion status of "miss" to the host memory.

The Cache Query (CQ) command instructs the CAM to return N valid cache entries, where N is a positive integer. The cache entries start from the specified cache entry index in the command. If there are no more valid entries in the cache before N is reached, CAM will stop returning entries once the last entry is reached. The Cache Key field in the CQ command is used to specify the number of valid cache entries to be returned (N), as well as the starting index of the last valid entry. The Host Buffer Address field of the command is used to specify where in host memory to place the returned cache entries. The L/R bit of the command indicates whether the Left of Right cache controller is to scan the cache and return the valid entries. The cache controller returns a completion status that indicates how many cache entries were returned and whether all of the entries have been scanned. The completion status also indicates the index of the last valid entry returned.

The cache commands described have referred to returning a completion status word. FIG. 13 shows an example of a format for a completion status word. The Completion Status Field (labeled Cmpl Status in FIG. 13) indicates the completion status of the cache command. The completion status field may include one or more the following: a Miss bit to indicate that the cache command resulted in a cache miss, an Error bit to indicate that execution of the command resulted in an error, and a Fail bit the cache command was not successful. A command failure has different meaning depending on the cache command. For instance, a Cache Evict command may fail due to the EC bit being 0. The completion status field may include a separate Insert-Fail bit to indicate the failure of a Cache Write command to insert a cache entry due to the cache being full in the case of a cache miss. The completion status field may also include one or more cyclic redundancy code (CRC) bits to indicate that the data read as result of a CR or CRM command had a CRC error. The cache controller may include CRC generating circuitry, and the CRC error may indicate that the CRC generated while reading the DRAM did not match the CRC stored in the cache metadata. The Completion Status Field may include a Q-End bit to indicate when the cache entries returned for a Cache Query command are the last valid entries in the cache. This bit is only applicable to the Cache Query command The completion status word may include additional fields. In some examples, the completion status word includes a "Furthest Cmpl Ptr" field that contains a pointer to the furthest completed cache command. The completion status word may include a CMD field that contains the original cache command for which the returned completion status corresponds, and may include a DRTY field of one bit to indicate the content of the "dirty" bit within the cache metadata. The DRTY field is only valid if the cache operation resulted in a hit. This bit is undefined for a Cache Query command.

The completion status word may include an OWNER field. The OWNER field may comprise one bit to indicate the "owner" of the cache entry (e.g., a cache line). A 0 in the field may indicate the left host as the owner and a 1 in the field may indicate the right host. The owner is the host whose Cache Write command resulted in an insert of the cache entry (e.g., as a result of a Cache Write miss). The OWNER field is used to for evicting a cache entry and for clearing the DRTY field in the metadata. For instance, a cache entry can only be evicted using the Cache Eviction command when the host issuing the Cache Eviction command is the owner of the cache entry. A DRTY bit in the metadata for a cache entry can only be set by a Cache Write command and the cache owner is determined at the time of the cache write. The DRTY bit can only be cleared by a Cache Modify Command sent from the owner of the cache entry when the Eviction Candidate bit is set. The OWNER field is undefined for the Cache Query command.

The completion status word may also include one or more of a L/R field, and an EC field. The L/R field can comprise one bit to indicate whether the Left or Right cache controller is returning data for the Cache Read, Cache Read Modify, and Cache Query commands. For instance, the Left cache controller will return data to the requesting host if the field is set to 0, and the Right cache controller will return data to the requesting host if the field is set to 1. The EC field may include a bit that indicates the value of the Eviction Candidate bit within the cache metadata when the cache command was executed. This bit is undefined for the CQ command.

The completion status word may include a sequence number (SEQ#) field. This field contains the original sequence number in the corresponding cache command. The contents of the SEQ field can originally be set by software as a cache command index in the command ring. This field can be used by software to quickly find the corresponding entry in the command ring buffer.

The completion status word may also include a Cache Key field and a Key Aging field. Like the command word, the Cache Key field contains the cache key within the cache metadata. If the cache command is a Cache Query command, this field indicates the number of entries returned in response to the Cache Query command and may also indicate the index of the last returned valid entry. The Key Aging field is a value stored in the cache metadata to track cache entry aging.

Overview of Cache Management Service

Figure 14A:
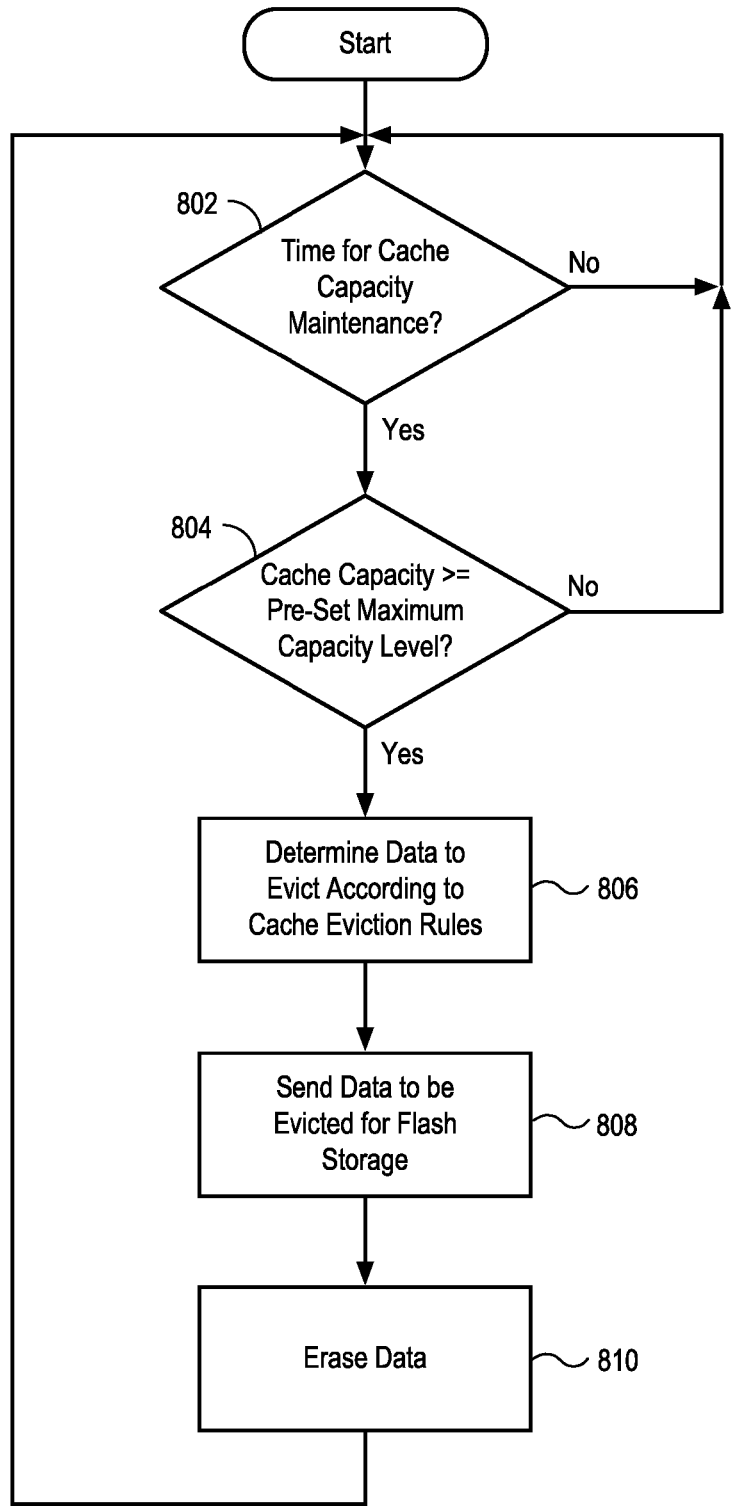
FIGS. 14A, 14B, and 14C illustrate example flow diagrams showing caching principles, policies, or rules implemented by the cache management of the system according to some embodiments.
Figure 14B:
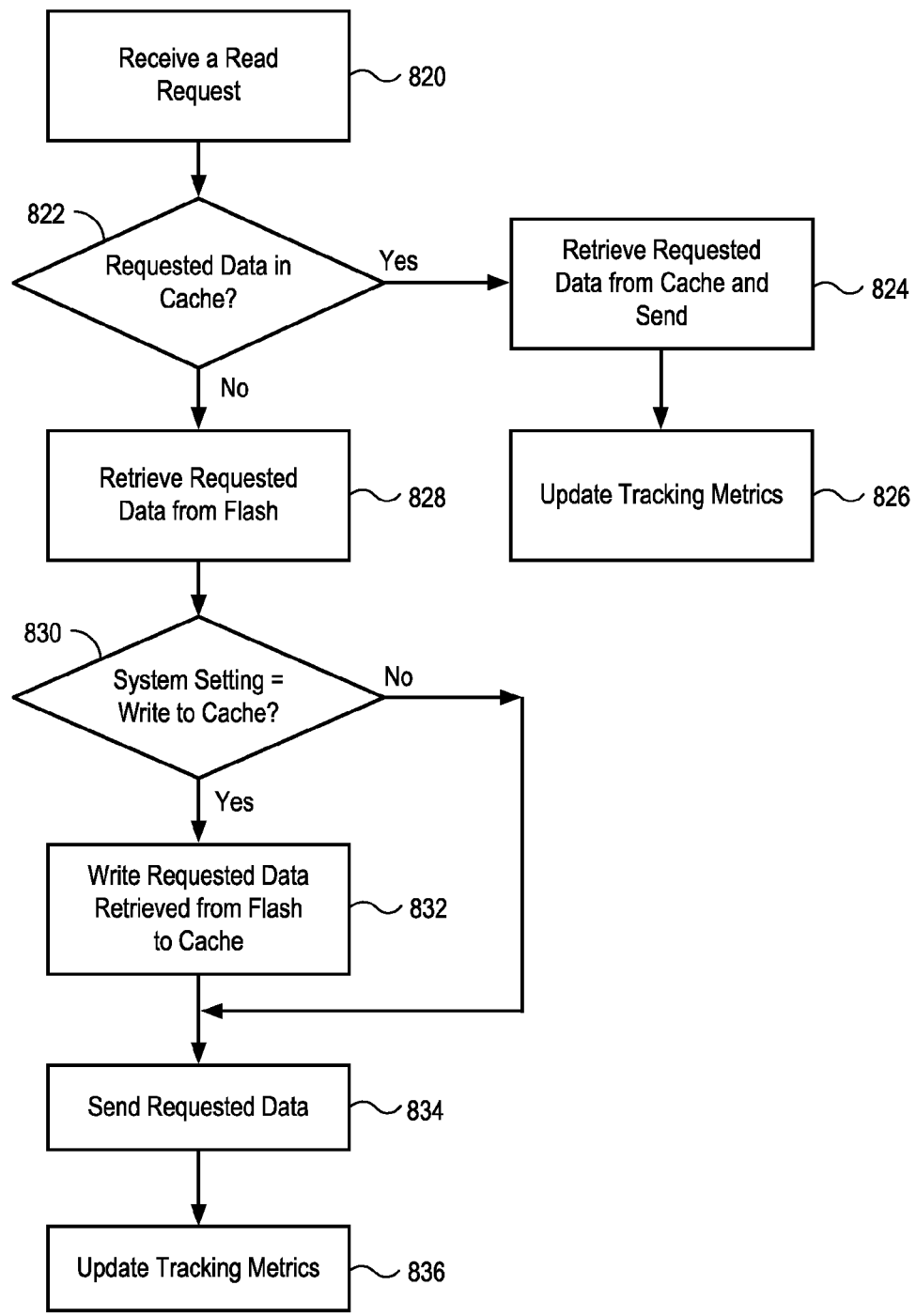
Figure 14C:
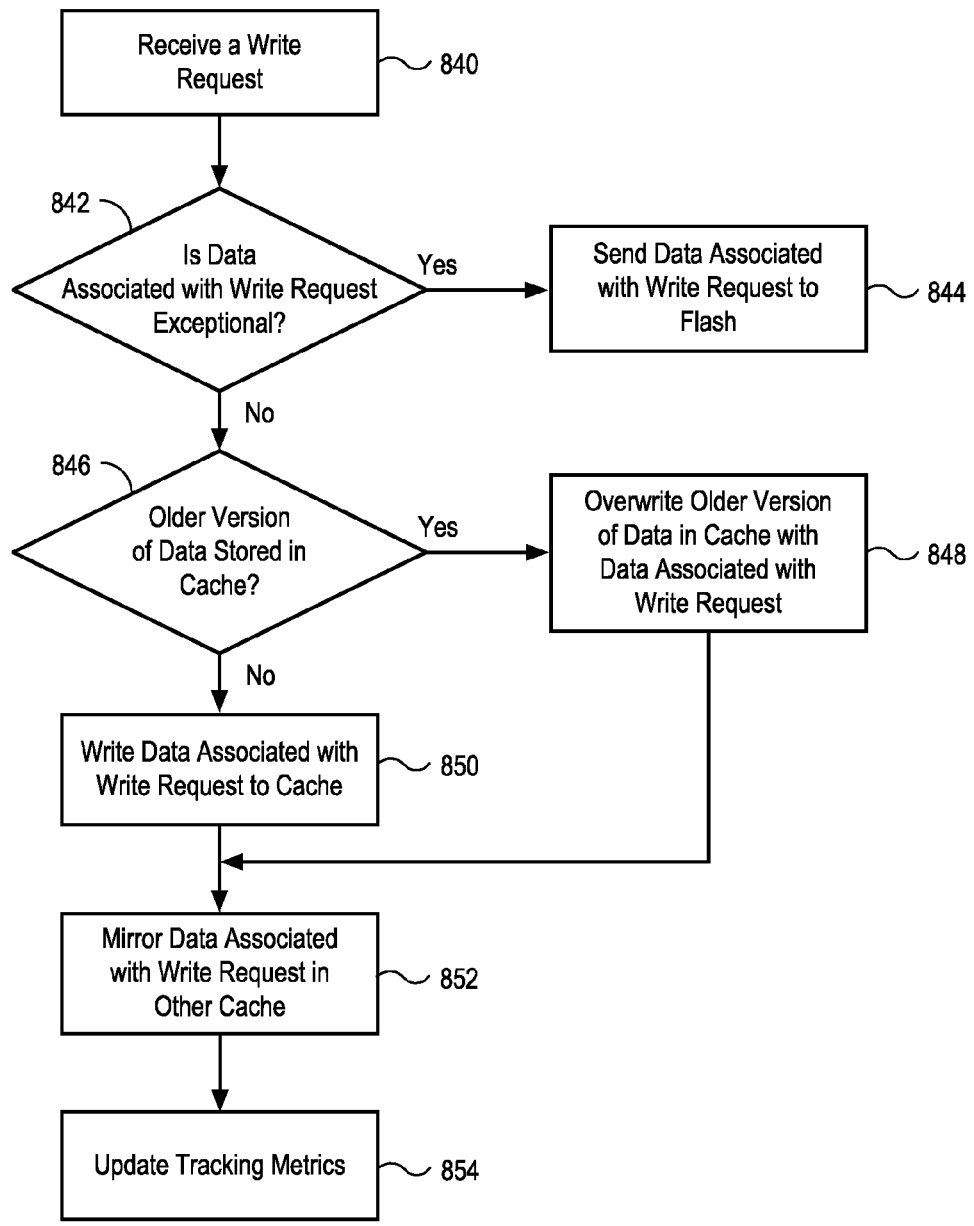

FIGS. 14A-14C are illustrative drawings showing example flow diagrams representing caching principles, policies, or rules implemented by the software driver (e.g., of a host on a server board) and cache controller according to some embodiments. The software driver performs cache capacity management operations to ensure that the cache modules always have sufficient capacity to handle I/O requests. If cache capacity is not adequately monitored and optimized, for example, there may not be enough space to fully handle a new write request. Cache management for cache modules are performed independently of each other.

Referring to FIG. 14A, it is determined whether it is time to perform cache capacity maintenance at block 802. Maintenance may be a continuous background operation, a periodic background operation, or on a need basis type of operation. Maintenance frequency can be a system setting, user setting, or dynamic setting based on current operating conditions of the system 100 of FIG. 1. If maintenance is initiated ('yes' branch of block 802), then at block 804 the cache controller determines whether the current data storage capacity of the cache modules 106-1 or 106-2 (depending on which set of cache modules is associated with the given cache controller of the packet processing circuit 118-1 and 118-2) is at or above a pre-set maximum capacity level. The pre-set maximum capacity level is a certain value that is pre-set by the system 100 or user, and represents the portion of the total data storage capacity of the cache modules that can be occupied while having a "safe" amount of available space in case, for example, an unexpectedly large write request is received. Examples of pre-set maximum capacity level include, but are not limited to, 70%, 80%, or some other value. In some embodiments, the pre-set maximum capacity level may be adjusted over time as more system usage information becomes available. Instead of expressing the pre-set maximum capacity level as a percentage of the total data storage capacity, for example, it is understood that it can be expressed as a minimum available or reserved free space.

If the current cache capacity is below the pre-set maximum capacity level ('no' branch of block 804), then the flow diagram returns to block 802. Otherwise the current cache capacity is too close to the pre-set maximum capacity level, and some of the stored data needs to be moved to the flash modules 110 and evicted or erased from the cache modules 106-1 or 106-2 (depending on which set of cache modules is associated with the given cache controller) ('yes' branch of block 804).

Next at block 806, the cache controller determines what data to displace from the associated cache modules according to a set of cache eviction rules, such as according to a Least Recently Used algorithm for example that evicts data that is the least used. Data that is "pinned" stays within the cache module based on a user specified directive.

Once the cache line(s) to empty are identified, at block 808 the cache controller sends data stored in those cache line(s) to the flash modules 110-1 to 110-8 for storage. Such data is erased, emptied, or evicted from those particular cache line(s) at block 810. The flow diagram then returns to block 802. Thus, the cache capacity of cache modules 106-1 or 106-2 (depending on which set of cache modules is associated with the given cache controller) is maintained at or below the pre-set maximum capacity level. It is understood that blocks 808 and 810 may occur simultaneously of each other.

FIG. 14B illustrates operations performed by the software driver and cache controller of the cache management subsystem in connection with a data read request from any of the I/O circuits 112-1 to 112-4. At block 820, a software driver of a host (e.g., a general purpose management processor 116) receives a read request originating from one of the I/O circuits 112-1 to 112-4. Assuming normal operation, the software driver handles read requests originating from I/O circuit 112-1 to 112-4 using the cache controllers included in the packet processing circuits 118-1, 118-2. The data request includes a particular memory address location of the flash modules 110-1 to 110-8 at which the requested data is stored. A command for the data request may be posted in a command buffer of a host device for loading by the cache controllers.

Next at block 822, a look-up of the key in a cache table is performed to determine whether the requested data exists in the cache modules 106-1, 106-2. If a matching cache key is found (a cache hit, or the 'yes' branch of block 822), the cache controllers access the data corresponding to the matching cache tag from the cache module 106-1, 106-2 and sends the retrieved data to the software driver and the data is sent to the originating I/O circuit at block 824. The retrieved data is the requested data in the read request. The tracking metrics (e.g., according to a least recently used algorithm) is updated at block 826. If the retrieved data was previously written to the cache module 106-1, 106-2 (in a previous write request) and such data was not evicted from the cache module due to cache management operations (see FIG. 14A), then such data is present in the cache module for later access such as the present read request. When data is present in the cache module there is no need to retrieve the data from the flash modules 110-1 to 110-8. Data retrieval from a DRAM cache is significantly faster than from flash-based memory, upwards of a thousand times faster using cache than flash.

If no matching cache key is found (a cache miss, or the 'no' branch of block 822), the requested data is not present in the cache modules 106-1, 106-2 and is retrieved from the flash modules. At block 828, the cache controllers initiate retrieval of the requested data from the appropriate flash modules. Both cache controllers load the cache read command posted by the software driver of host. Both cache controllers perform the command, but only one cache controller may return the cache read data to the host.

Next at block 830, a system setting (or user specified setting) is checked to see whether the requested data retrieved from one or more of the flash modules 110-1 to 110-8, should be copied to the cache modules. If the system is set to not copy the data to cache modules ('no' branch of block 830) then the flow diagram proceeds to block 834. Otherwise the retrieved data is copied to the cache modules ('yes' branch of block 830 and block 832). The retrieved data is also sent to the I/O circuit, one of 112-1 to 112-4 that made the read request at block 834. The associated tracking metrics (e.g., for a least recently used algorithm) are also updated at block 836.

FIG. 14C is an illustrative flow diagram representing operations performed by the software driver and cache controller of the cache management subsystem in connection with a data write request from any of the I/O circuits 112-1 to 112-4 in accordance with some embodiments.

At block 840, the software driver of a host receives a write request originating from one of the I/O circuits 112-1 to 112-4, and the request is then passed onto the cache controllers included in the packet processing circuits 118-1, 118-2 (assuming normal operational state of the system 100). The data request includes the data to be written as well as a particular memory address location of the flash modules at which the data is to be written.

At block 842, the software driver determines whether the data associated with the write request is exceptional. While the default rule is to store all data associated with write requests to the cache modules packet processing circuits 118-1, 118-2 and then at some later point in time copy data from the cache modules to the flash modules 110-1 to 110-8, one or more exceptions to the default rule may be implemented. One or more exception criteria may be a system setting or user specified setting. For example, the exception may comprise there being no exception to the default rule. As another example, data exceeding a certain size (e.g., data that if written to the cache modules may exceed the cache capacity or likely to exceed the pre-set maximum capacity level) may warrant storing directly in the flash modules without first storing in the cache modules. As still another example, the write request or the data associated with the write request itself may specify that the data will be rarely accessed (e.g., is archival data) or has a certain characteristic that warrants being stored directly in the flash modules 110-1 to 110-8 without first being stored in the cache modules 106-1, 106-2.

If the data associated with the write request is determined to be exceptional ('yes' branch of block 842), then such data is sent to the flash modules for writing 110-1 to 110-8 at block 844. Otherwise the data associated with the write request is not exceptional ('no' branch of block 842) and operations are performed to write to the cache modules 106-1, 106-2. At block 846, the cache table is checked for a key of the cache data containing the same flash memory address location as provided in the write request.

If a matching cache key is found ('yes' branch of block 846), this means that an older version of the data associated with the write request (or some data in general) is currently stored in the cache line(s) now intended for the data associated with the write request. The cache controllers facilitate overwriting the existing data at these cache line(s) with the data associated with the write request at block 848. Then the flow diagram proceeds to block 852. If no matching cache key is found ('no' branch of block 846), then the cache controllers facilitate writing the data associated with the write request to empty/available cache line(s) in the cache modules 106-1, 106-2 at block 850.

Next at block 852, the data associated with the write request is additionally copied to empty/available cache line(s) in the cache modules 106 associated with the other FPGA packet processing circuit. A cache command associated with the write request is posted by the software driver of the host and loaded by both cache controllers. In this way, the write request from the I/O circuit is formed into two identical requests, one going to the packet processing circuit 118-1 and the other to the packet processing circuit 118-2. Then the cache controller in each of the packet processing circuits can store the data associated with the write request (also referred to as write data) in its respective cache modules. At block 854, the associated tracking metrics are updated to reflect the addition of the data associated with the write request into certain cache line(s) of the cache modules.

Because flash modules 110-1 to 110-8 comprise the primary or permanent data storage medium for the storage system 100, the data associated with the write request, although already written to the cache modules 106-1, 106-2 (see blocks 848 and 850), is eventually written to the flash modules 110-1 to 110-8. Nevertheless, cache management of the system 100 is configured to intelligently perform data writes to the flash modules taking into account the characteristics of the flash modules. In order to prolong the usability of flash modules, which are limited to a certain number of writes before degrading, the cache management accumulates certain type of data corresponding to a plurality of write requests and then performs a single write of the accumulated data to flash modules rather than performing a write to flash modules for each write request. This means that if, for example, there are 25 write requests, instead of writing to flash modules 25 times or once for each of the 25 write requests, the data corresponding to these 25 write requests may be written at the same time and once (e.g., a single write operation) to the flash modules.

Accordingly, the cache management acts as a middleman between the I/O circuits 112-1 to 112-4 and flash modules 110-1 to 110-8 for every read and write requests from the I/O circuits. For all read and write requests, the presence of data associated with the read or write request in the cache modules 106-1, 106-2 is checked before the flash modules are involved. Based on the presence or absence of such data in the cache modules, the cache management performs optimization operations to complete the data requests significantly faster than is possible with flash modules alone. The cache management also prolongs the useful lifespan of flash modules by minimizing the number of writes to flash modules without sacrificing completeness of data being stored in the flash modules. Data associated with write requests are written to cache memory (prior to be written to flash modules) unless the data fits an exception. Data associated with read requests that are retrieved from the flash modules may or may not be written to cache modules corresponding to both packet processing circuits (depending upon a system or user setting). The cache management actively maintains the used storage capacity level of the cache modules at or below a pre-set capacity level (e.g., 70%, 80%, etc.) by evicting data stored in the cache modules that fit one or more eviction rules, as needed. An example of an eviction rule comprises evicting data that has the least amount of access (read or write) and moving it to the flash modules.

Although the present invention has been described in connection with some embodiments, it is not intended to be limited to the specific form set forth herein. One skilled in the art would recognize that various features of the described embodiments may be combined in accordance with the invention. Moreover, it will be appreciated that various modifications and alterations may be made by those skilled in the art without departing from the scope of the invention.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A system comprising:
   a first cache controller; and
   at least a second cache controller, wherein the first cache controller and the second cache controller each include:
   a cache memory interface;
   an inter-cache controller communication link configured for bidirectional communication with the other cache controller;
   a first peripheral interface configured for communication with a first host device and a second peripheral interface configured for communication with a second host device, wherein the first host device and the second host device are each connected to the first and second cache controllers by the first and second peripheral interfaces;
   a first-in-first-out memory buffer (FIFO) configured to store cache commands loaded from at least one of the first and second host devices; and
   logic circuitry configured to load one or more cache commands over at least one of the first peripheral interface from a cache command memory of the first host device to the FIFO and the second peripheral interface from a cache command memory of the second host device to the FIFO, to synchronize performance of cache commands stored in the FIFO with performance of the same cache commands stored in a FIFO of the other cache controller, based upon communication over the inter-cache controller communication link, and to perform the cache commands.

2. The system of claim 1, wherein the logic circuitry is configured to synchronize performance of cache commands by reordering cache commands stored in the FIFO of the cache controller to match an execution order of commands of the FIFO of the other cache controller.

3. The system of claim 2, wherein the logic circuitry is configured to synchronize performance of cache commands by ordering cache commands in the FIFO according to a cache entry index of the cache memory electrically coupled to the cache memory interface.

4. The system of claim 1, wherein a cache controller includes a first content addressable memory (CAM) configured to store one or more queues containing cache commands, wherein a queue includes a sequence of cache commands for a specified cache entry index for the cache memory, and wherein the cache commands in the one or more queues in the first cache controller match the cache commands in the one or more queues in the second cache controller.

5. The system of claim 4, wherein a cache controller includes a second CAM including associative memory configured to describe the contents of the cache memory.

6. The system of claim 1 including:
the first host device connected to the first peripheral interface of the first cache controller and connected to the second peripheral interface of the second cache controller; and
the second host device connected to the second peripheral interface of the first cache controller and connected to the first peripheral interface of the second cache controller.

7. The system of claim 6, wherein the first host device and the second host device are servers.

8. The system of claim 1, including a first peripheral component interconnect express (PCIe) switch circuit and a second PCIe switch circuit, wherein the first host device is configured to communicate information with the first and second cache controllers via the first PCIe switch circuit and wherein the second host device is configured to communicate information with the first and second cache controllers via the second PCIe switch circuit.

9. The system of claim 1, including a first cache memory coupled to the first cache controller and a second cache memory coupled to the second cache controller, wherein the contents of the first and second cache memories are identical after the cache commands are performed.

10. A method of managing access to cache memory, the method comprising:
posting a first cache command in a first command buffer by a first host device and posting a second cache command in a second command buffer by a second host device;
loading the first cache command and the second cache command into a first-in-first-out (FIFO) buffer memory of a first cache controller and loading the first cache command and the second cache command into a FIFO buffer memory of a second cache controller, wherein the first cache controller is configured to perform cache management tasks for a first cache memory and the second cache controller is configured to perform cache management tasks for a second cache memory;
synchronizing an order of execution of the first and second cache commands in the FIFO buffer memories of the first and second cache controllers; and
performing the first and second cache commands in the synchronized order using the first cache controller and performing the first and second cache commands in the synchronized order using the second cache controller, wherein contents of data storage of the first cache memory and the second cache memory are substantially identical after the performing of the first and second cache commands.

11. The method of claim 10, wherein synchronizing an order of execution of the first and second cache commands includes communicating completion of loading of the first and second cache commands between the first and second cache controllers and communicating the size of the loaded cache commands between the first and second cache controllers.

12. The method of claim 10, including communicating a buffer size of loaded cache commands between the first and second cache controllers and ordering the cache commands identically in the buffer memory of the first cache controller and the buffer memory of the second cache controller.

13. The method of claim 10, including transferring cache commands to a queue in a content addressable memory (CAM) of each of the first cache controller and the second cache controller such that the queue of the first cache controller matches the queue of the second cache controller, wherein a queue includes a sequence of cache commands for a specified cache entry index for the cache memory.

14. The method of claim 10, including:
transferring status information of a cache write command into memory of the first host device by the first cache controller upon completion of the cache write command by the first cache controller and transferring status information of the cache write command into memory of the first host device by the second cache controller upon completion of the cache write command by the second cache controller; and
freeing space in data memory of the first host device when completion information from the first cache controller and the second cache controller is received by the first host device.

15. The method of claim 10, including:
transferring data from the first cache memory by the first cache controller upon completion of a cache read command by the first cache controller and transferring data from the second cache memory by the second cache controller upon completion of the cache read command by the second cache controller.

16. The system of claim 1,
wherein the logic circuitry is configured to communicate completion of loading of the first and second cache commands over the over the inter-cache controller communication link to the second cache controller, and to perform the cache commands.

17. The system of claim 1,
wherein at least one of the first cache controller and the second cache controller is included in a reconfigurable field programmable gate array (FPGA).

18. The system of claim 1,
Wherein at least one of the first cache controller and the second cache controller is included in an application specific integrated circuit (ASIC).

* * * * *

UNITED STATES PATENT AND TRADEMARK OFFICE
CERTIFICATE OF CORRECTION

PATENT NO. : 9,672,180 B1
APPLICATION NO. : 14/552329
DATED : June 6, 2017
INVENTOR(S) : Morshed et al.

It is certified that error appears in the above-identified patent and that said Letters Patent is hereby corrected as shown below:

On page 2, in Column 2, item (56) References Cited, under "Other Publications", Line 28, delete "Simplied-Multi-Host" and insert --Simplified-Multi-Host-- therefor Signed and Sealed this
Thirteenth Day of February, 2018

Andrei Iancu
*Director of the United States Patent and Trademark Office*